US009078348B1

(12) United States Patent
Grandin et al.

(10) Patent No.: US 9,078,348 B1
(45) Date of Patent: Jul. 7, 2015

(54) APPARATUS FOR PROVIDING UTILITY RECEPTACLES AND CABLES AT A SELECTED LOCATION ON A WORKSTATION

(71) Applicants: Andrew Grandin, Stamford, CT (US); David Black, Orange, CT (US); Michael O'Keefe, Wethersfield, CT (US)

(72) Inventors: Andrew Grandin, Stamford, CT (US); David Black, Orange, CT (US); Michael O'Keefe, Wethersfield, CT (US)

(73) Assignee: Premier Manufacturing Group, Inc., Shelton, CT (US)

( * ) Notice: Subject to any disclaimer, the term of this patent is extended or adjusted under 35 U.S.C. 154(b) by 205 days.

(21) Appl. No.: 13/913,470

(22) Filed: Jun. 9, 2013

Related U.S. Application Data

(60) Provisional application No. 61/822,387, filed on May 12, 2013.

(51) Int. Cl.
*H02B 1/20* (2006.01)
*H05K 5/00* (2006.01)
*H05K 7/02* (2006.01)
*F16B 21/08* (2006.01)
*H05K 5/02* (2006.01)

(52) U.S. Cl.
CPC ............... *H05K 7/02* (2013.01); *F16B 21/084* (2013.01); *H05K 5/02* (2013.01); *H05K 5/0247* (2013.01)

(58) Field of Classification Search
CPC ..... H02G 3/185; H02G 11/003; A47B 21/06; H05K 7/02; H05K 5/0247; H05K 5/02; H05K 5/0226; F16B 21/084
USPC ................... 361/679.27, 679.44, 826, 679.01
See application file for complete search history.

(56) References Cited

U.S. PATENT DOCUMENTS

| | | | | |
|---|---|---|---|---|
| 4,721,476 A * | 1/1988 | Zeliff et al. | .................... | 439/142 |
| 5,230,552 A * | 7/1993 | Schipper et al. | ........... | 312/223.6 |
| 6,338,301 B1 * | 1/2002 | Almond | ..................... | 108/50.02 |
| 6,378,171 B1 * | 4/2002 | Suzuki et al. | .................... | 16/342 |
| 7,045,706 B1 * | 5/2006 | Lincoln et al. | ................. | 174/482 |
| 7,567,829 B2 * | 7/2009 | Lai et al. | ..................... | 455/575.3 |
| 7,830,460 B2 * | 11/2010 | Ido | ................. | 348/837 |
| 7,901,224 B1 * | 3/2011 | Black et al. | ................... | 439/142 |
| 7,966,951 B1 * | 6/2011 | Black et al. | ................ | 108/50.02 |
| 7,999,419 B2 * | 8/2011 | Drane et al. | ................... | 307/326 |
| 8,295,036 B2 * | 10/2012 | Byrne | ...................... | 361/679.01 |
| 8,901,419 B2 * | 12/2014 | Galasso | .......................... | 174/53 |
| 2007/0119025 A1 * | 5/2007 | Hu | ................... | 16/340 |
| 2009/0014196 A1 * | 1/2009 | Peck | ............................... | 174/54 |
| 2009/0134057 A1 * | 5/2009 | Hidalgo Vargas | ............ | 206/600 |

(Continued)

*Primary Examiner* — Adrian S Wilson
*Assistant Examiner* — Abhishek Rathod
(74) *Attorney, Agent, or Firm* — Raymond A. Nuzzo

(57) ABSTRACT

An apparatus for providing utility receptacles and VGA cables at a selected location of a workstation. The apparatus has a receptacle enclosure housing and a component housing that is movably attached to the receptacle enclosure housing. The component housing can be pivoted to a horizontal position or vertical position. An elongate member is removably inserted into a first combination of through-holes to maintain the component housing in a horizontal position under the work surface of a work station. In order to orient the component housing in a vertical position, the elongate member is removed from the first combination of through-holes and the component housing is pivoted to a vertical position. The elongate member is then reinserted into a second combination of through-holes in order to maintain the component housing in the vertical position. The apparatus provides a plurality of utility receptacles and has a cable retractor and VGA switching device.

31 Claims, 25 Drawing Sheets

(56) References Cited

U.S. PATENT DOCUMENTS

| | | |
|---|---|---|
| 2010/0147547 A1* | 6/2010 | Drane et al. .................... 174/50 |
| 2010/0163301 A1* | 7/2010 | Jolly ............................. 174/488 |
| 2011/0006146 A1* | 1/2011 | Soper et al. .................. 242/373 |
| 2012/0175452 A1* | 7/2012 | Feldstein et al. .............. 242/381 |
| 2013/0113425 A1* | 5/2013 | Kauffmann ................... 320/109 |
| 2013/0277085 A1* | 10/2013 | Dinh et al. ...................... 174/50 |
| 2014/0000956 A1* | 1/2014 | Wurms et al. ................ 174/535 |
| 2014/0347790 A1* | 11/2014 | Kobayashi ................... 361/622 |

* cited by examiner

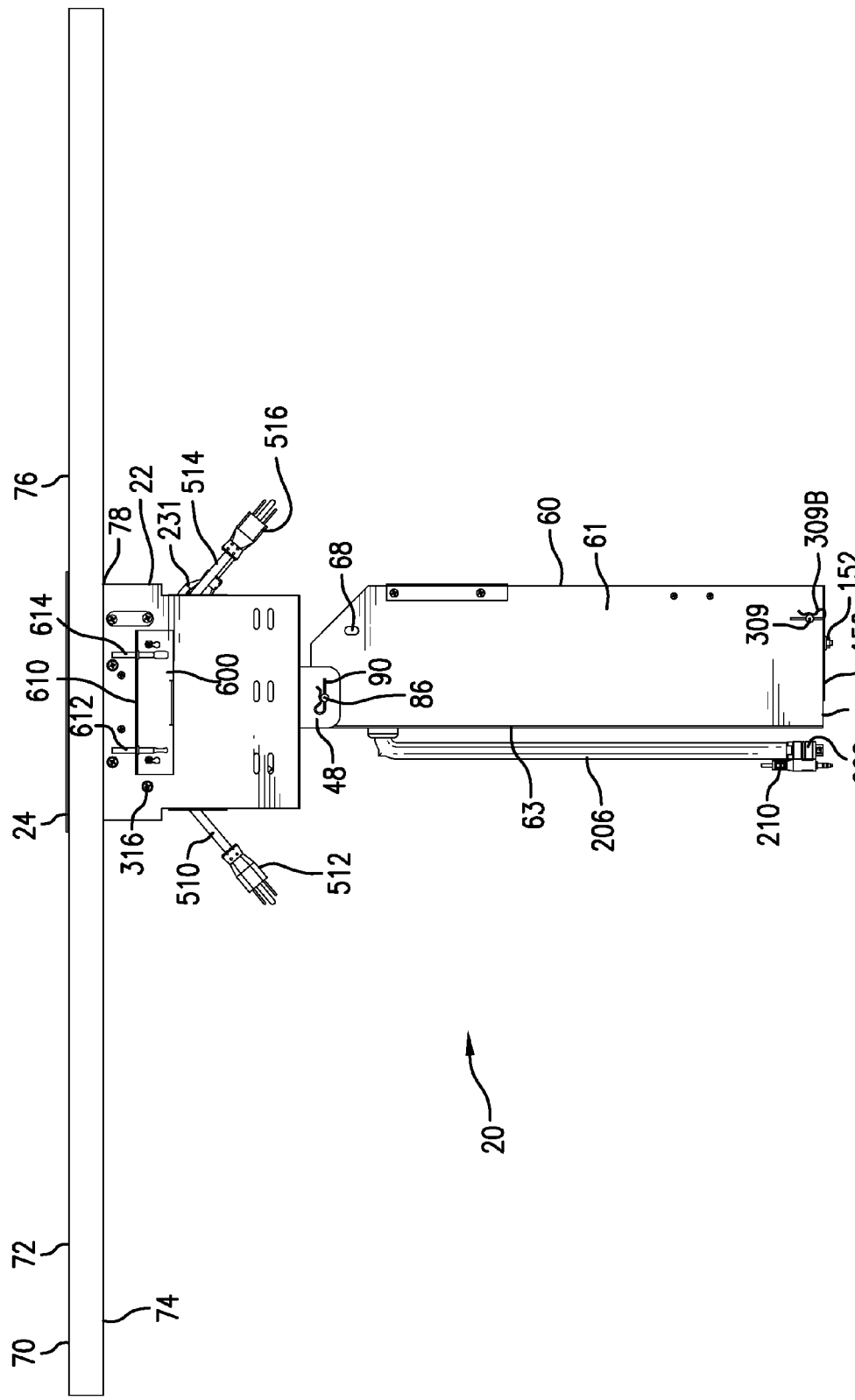

APPARATUS FOR PROVIDING UTILITY RECEPTACLES AND CABLES AT A SELECTED LOCATION ON A WORKSTATION

CROSS-REFERENCE TO RELATED APPLICATIONS

This application claims the benefit of U.S. provisional patent application No. 61/822,387, filed May 12, 2013. The entire disclosure of U.S. application No. 61/822,387 is hereby incorporated by reference.

BACKGROUND OF THE INVENTION (1) Field of the Invention

The present invention generally relates to an apparatus for providing utility receptacles and cables at a selected location on a workstation.

(2) Description of Related Art

Devices for providing electrical power and computer data receptacles are known in the art. Typical prior art devices are described in U.S. Pat. Nos. 5,230,552, 5,709,156, 7,614,889, 7,901,224, 7,966,951, 8,119,910, 8,174,379, and 8,317,537. Cable retractors are described in U.S. Patent Application Publication Nos. 2012/0175452 and 2011/0006146. Typically, such cable retractors can be positioned either in a horizontal or vertical position. In order to support the cable retractor when in the horizontal position, a bracket, hook or similar device is attached to the bottom side of the work surface. Such a configuration is shown in FIG. 1 of the aforesaid U.S. Patent Application Publication No. US2012/0175452.

SUMMARY OF THE INVENTION

The present invention is directed to, in one aspect, an apparatus for providing utility receptacles and cables at a selected location on a workstation. The apparatus comprises a receptacle enclosure housing having an upper peripheral portion, a top opening surrounded by the upper peripheral portion and an interior region that is accessible through the top opening. The receptacle enclosure housing includes a bottom having a bottom opening that provides access to the interior region. The receptacle enclosure housing includes a receptacle support structure located within the interior region which comprises a pair of walls and a bottom member. The receptacle support further comprises at least one utility receptacle attached to one of the walls. The receptacle enclosure housing has a pair of through-holes that are spaced apart and aligned with each other. The apparatus further comprises a component housing which comprises a first side which has a first plurality of through-holes therein and a second side which has a second plurality of through-holes therein. A first through-hole in the first plurality of through-holes is aligned with a first through-hole in the second plurality of through-holes so as to form a first pair of aligned through-holes of the component housing. A second through-hole in the first plurality of through-holes is aligned with a second through-hole in the second plurality of through-holes so as to form a second pair of aligned through-holes of the component housing. The first pair of aligned through-holes of the component housing are aligned with the through-holes in the receptacle enclosure housing when the component housing is pivoted to a horizontal orientation. The second pair of aligned through-holes of the component housing are aligned with the through-holes in the receptacle enclosure housing when the component housing is pivoted to a vertical orientation. The component housing and all portions of the receptacle enclosure housing, except the peripheral portion, are sized to fit into an opening in a work surface of a work station such that the peripheral portion rests upon the work surface and the remaining portion of the receptacle enclosure housing and the entire component housing is positioned below the work surface. An elongate member is removably inserted through the first pair of aligned through-holes of the component housing and the through-holes in the receptacle enclosure housing in order to position the component housing in a horizontal position below the work surface when the apparatus is mounted to a work station. In order to position the component housing in a vertical orientation, the elongate member is removed from the first pair of aligned through-holes of the component housing and the through-holes in the receptacle enclosure housing so as to allow the component housing to pivot to the vertical orientation. The elongate member is then inserted through the through-holes in the receptacle enclosure and the second pair of aligned through-holes of the component housing in order to secure the component housing in the vertical orientation so as to prevent movement of the component housing.

The apparatus further comprises a VGA cable having a first end located within the component housing and a second end located within the interior region of the receptacle enclosure housing and accessible through the top opening. The first end of the cable has a first VGA connector and the second end of the cable has a second VGA connector. The apparatus further comprises a VGA switching device located within the component housing. The VGA switching device comprises a plurality of VGA signal inputs and a VGA signal output. The first VGA connector is connected to one of the VGA signal inputs. The VGA switching device further comprises an output VGA cable connected to the VGA signal output. The output VGA cable includes a VGA connector for connecting the output VGA cable to a peripheral device.

The apparatus further comprises a cable retractor system that engages the VGA cable and comprises a multi-section housing comprising a pulley housing located within and attached to the component housing and a cable stop housing. The cable stop housing extends through the opening in the bottom panel of the receptacle enclosure housing and into the interior region. The cable stop housing is attached to a plate member that is attached to the receptacle support structure. The plate member functions as the bottom member of the receptacle support structure. The cable stop housing is pivotally coupled to the pulley housing such that the pulley housing and cable stop housing can be rotated with respect to each other. Since the pulley housing is attached to the component housing, both the pulley housing and component housing pivot together.

The cable retractor system further comprises a pulley assembly within the pulley housing. The pulley assembly is configured to retract the VGA cable. The pulley assembly comprises a mechanism that produces a constant force that urges the pulley assembly to retract the VGA cable. The cable retractor system further comprises a cable stop assembly coupled to the cable stop housing. The VGA cable is routed through cable stop housing and the cable stop assembly. The cable stop assembly is configured to have a first state that frictionally detains the VGA cable which prevents the pulley assembly from retracting the VGA cable and a second state that releases the VGA cable thereby allowing the pulley assembly to retract the VGA cable. The cable stop assembly is normally in the first state. The cable stop assembly further comprises a cable stop actuator device that configures the cable stop assembly to the second state to release the VGA cable so as to allow the pulley assembly to retract the VGA cable. The cable stop actuator device comprises an actuator button which, when depressed, configures the cable stop assembly to the second state.

BRIEF DESCRIPTION OF THE DRAWINGS

A more complete understanding of the invention and many of the attendant advantages thereto will be appreciated as the same becomes better understood by reference to the following detailed description when considered in conjunction with the accompanying drawings wherein corresponding reference characters indicate corresponding parts throughout the several views of the drawings and wherein:

FIG. 24 is a side elevational view of the apparatus of the present invention mounted to a workstation wherein the component housing is positioned in a vertical position;

DESCRIPTION OF THE INVENTION

As used herein, the term "utility receptacle" refers to power receptacles, audio signal receptacles and connectors, video signal receptacles and connectors, computer data connectors and receptacles, USB ports, Ethernet ports, Firewall ports, HDMI ports, HDTV ports and any registered jack including RJ11, RJ14, RJ21, RJ45 and RJ48.

Although the ensuing description is in terms of the apparatus of the present invention being applicable to workstations, it is to be understood that the invention may be used with work benches, tables, office furniture, desks, conference tables, etc.

Figure 12:
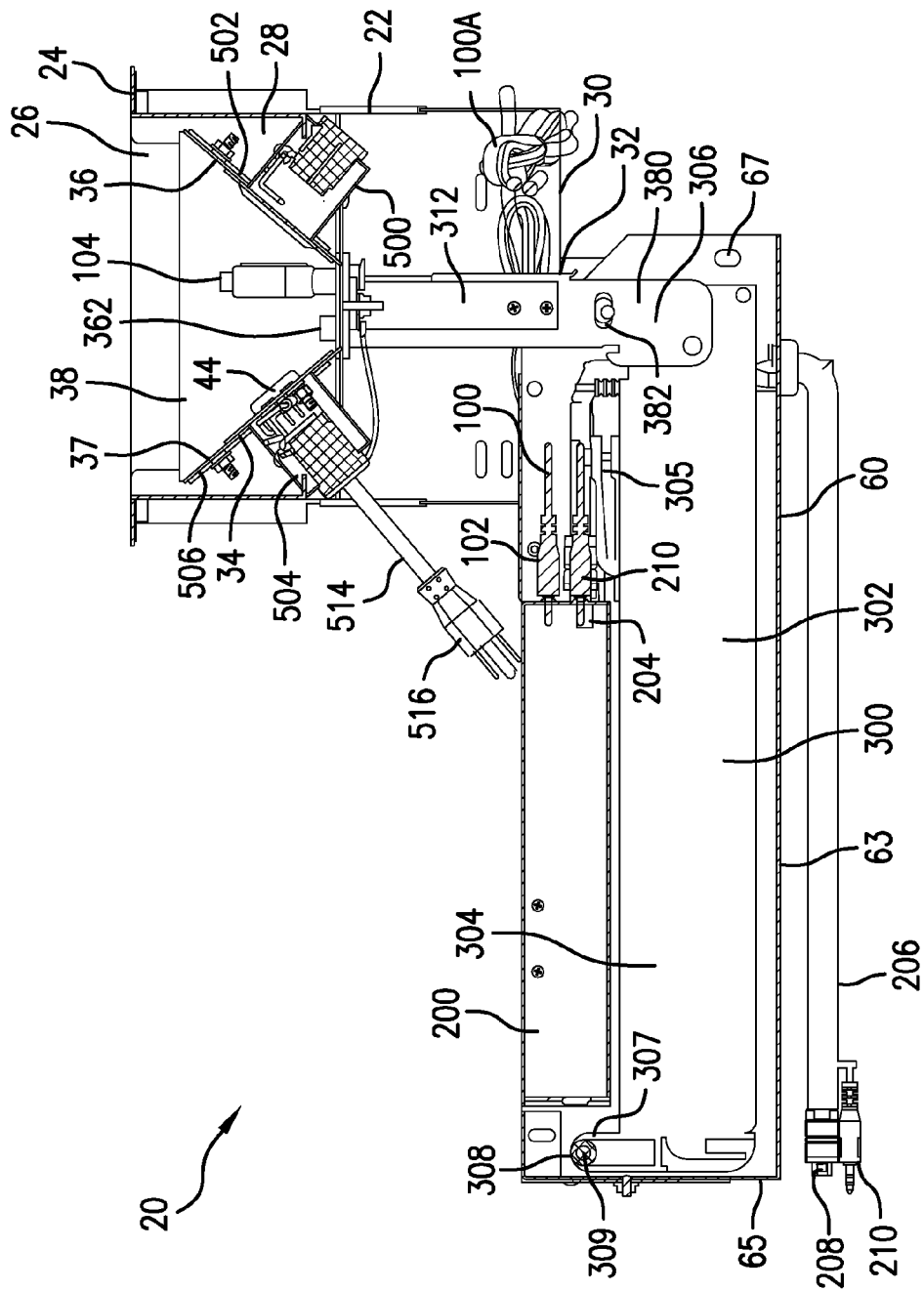
FIG. 12 is cross-sectional view taken along line 12-12 in FIG. 11.

Referring to FIGS. 1-9, there is shown apparatus 20 for providing utility receptacles and cables at a selected location on a workstation in accordance with present invention. Apparatus 20 comprises receptacle enclosure housing 22 having upper peripheral portion 24, top opening 26 which is surrounded by upper peripheral portion 24 and interior region 28 that is accessible through top opening 26. Receptacle enclosure housing 22 includes bottom side 30 having an opening 32 that provides access to interior region 28 (see FIG. 12). Receptacle enclosure housing 22 further comprises receptacle support structure 34 that is located within interior region 28. Receptacle support structure 34 comprises a pair of lengthwise walls 36 and 37 and widthwise walls 38 and 39, and plate member 40 which functions as the bottom of receptacle support structure 34. Plate member 40 is a separate member that is attached to extending sections 41 and 42 of receptacle support structure 34 (see FIGS. 7 and 13). Extending sections 41 and 42 are attached to lengthwise walls 36 and 37. In a preferred embodiment, extending sections 41 and 42 are integrally formed with lengthwise walls 36 and 37. Grounding wire 35 is attached to plate member 40 when plate member 40 is attached to extending sections 41 and 42. Screws 316 are used for attaching together the receptacle enclosure housing 22 and receptacle support structure 34.

In a preferred embodiment, each widthwise wall 38 and 39 has a generally "V" shape that causes lengthwise walls 36 and 37 to be angulated with respect to plate member 40. Thus, lengthwise walls 36 and 37 are angulated away from each other. Such a configuration is disclosed in commonly owned U.S. Pat. No. 7,966,951, issued Jun. 28, 2011, entitled "Apparatus For Dispensing Utilities At A Selected Location Of A Workstation", the disclosure of which patent is hereby incorporated by reference. Receptacle support structure 34 further comprises utility receptacles 43 and 44 that are attached to walls 36 and 37, respectively. In one embodiment, utility receptacles 43 and 44 are AC power receptacles. Lengthwise walls 36 and 37 also have openings that are sized for attachment of other utility receptacles depending upon the user's needs. Such openings are covered by removably cover inserts 45A and 45B (see FIGS. 11 and 13). Referring to FIGS. 1-3, 5-6, 9 and 21, receptacle enclosure housing 22 further comprises a pair of brackets 46 and 48 extending from bottom member 30. Opening 32 in bottom 30 is between brackets 46 and 48. Brackets 46 and 48 are substantially perpendicular to bottom member 30. Bracket 46 has through-hole 50 and bracket 48 has through-hole 52 which is aligned with through-hole 50.

Figure 1:
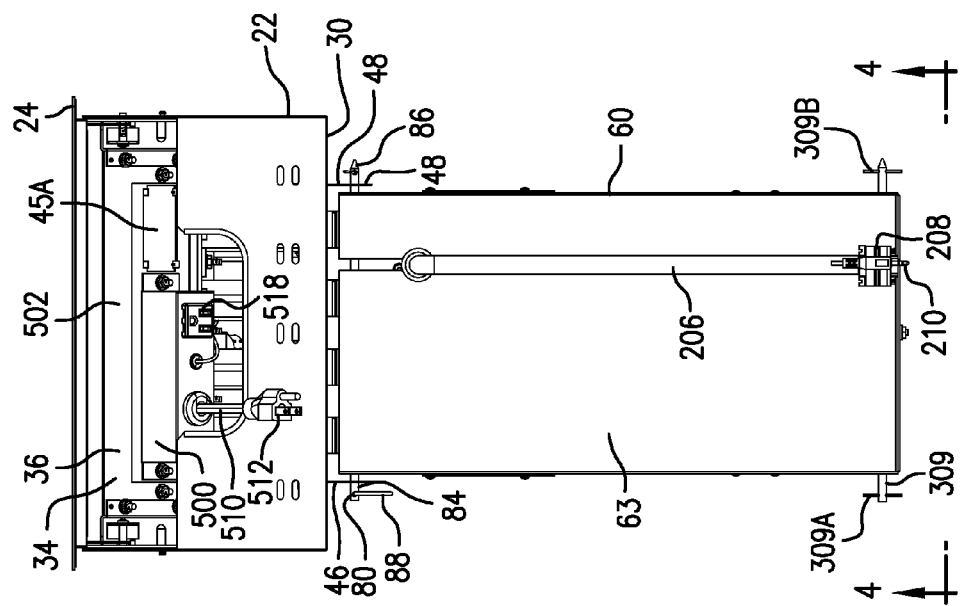
FIG. 1 is a front view, in elevation, showing an apparatus for providing utility receptacles and cables at a selected location on a workstation in accordance with the present invention, the view showing a component housing of the apparatus in a vertical position.
Figure 2:
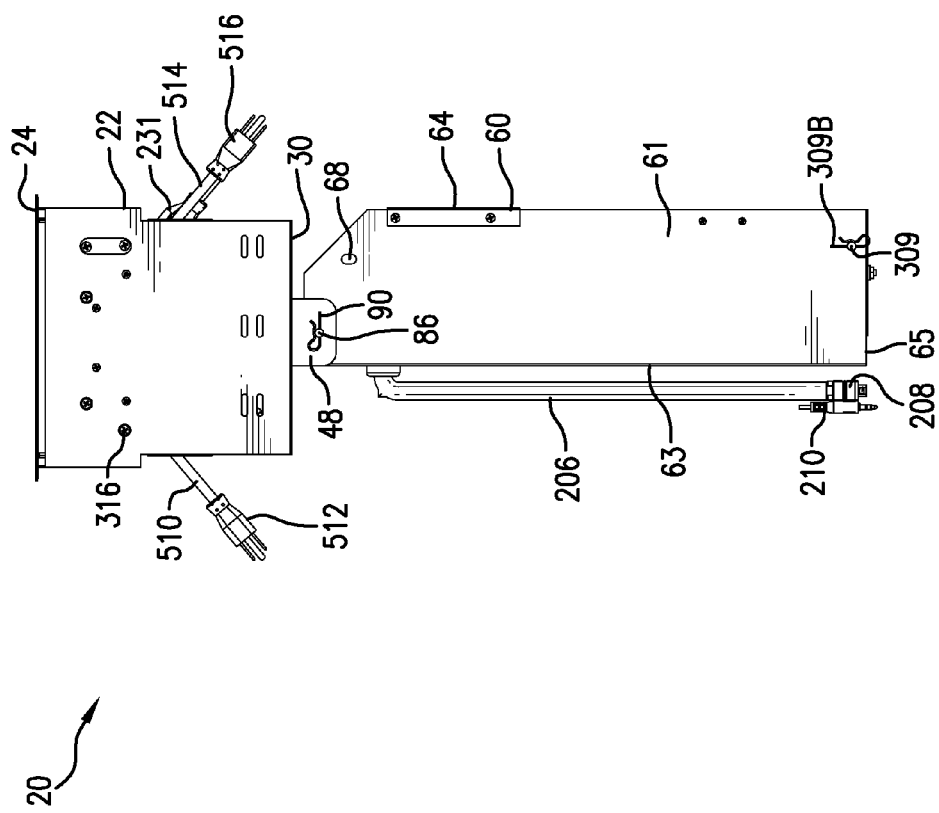
FIG. 2 is a left side view thereof, the component housing being shown in the vertical position.
Figure 3:
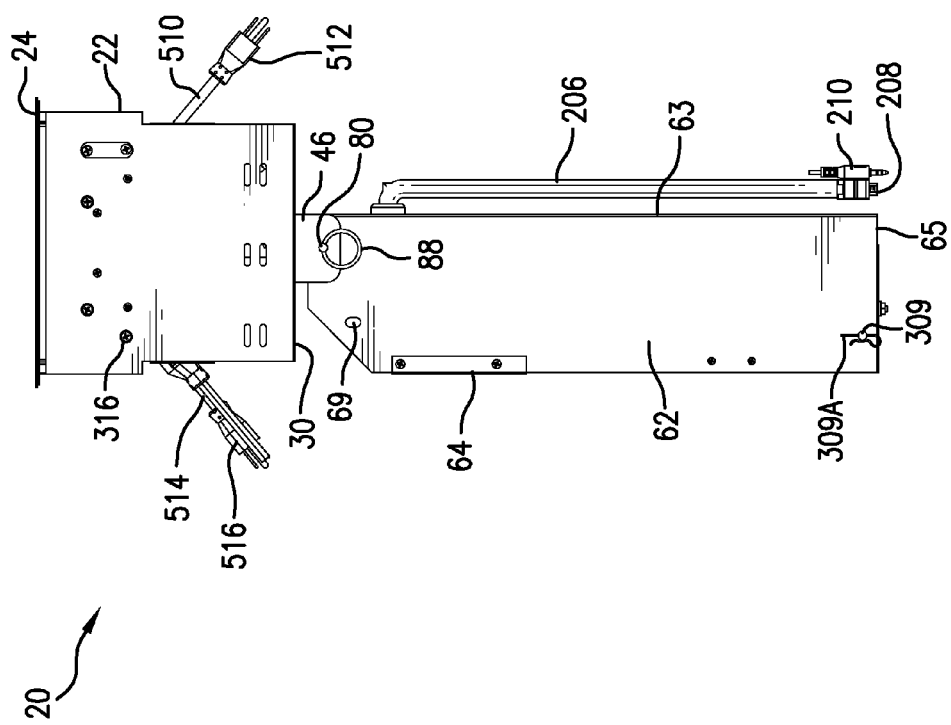
FIG. 3 is a right side view thereof, the component housing being in the vertical position.
Figure 4:
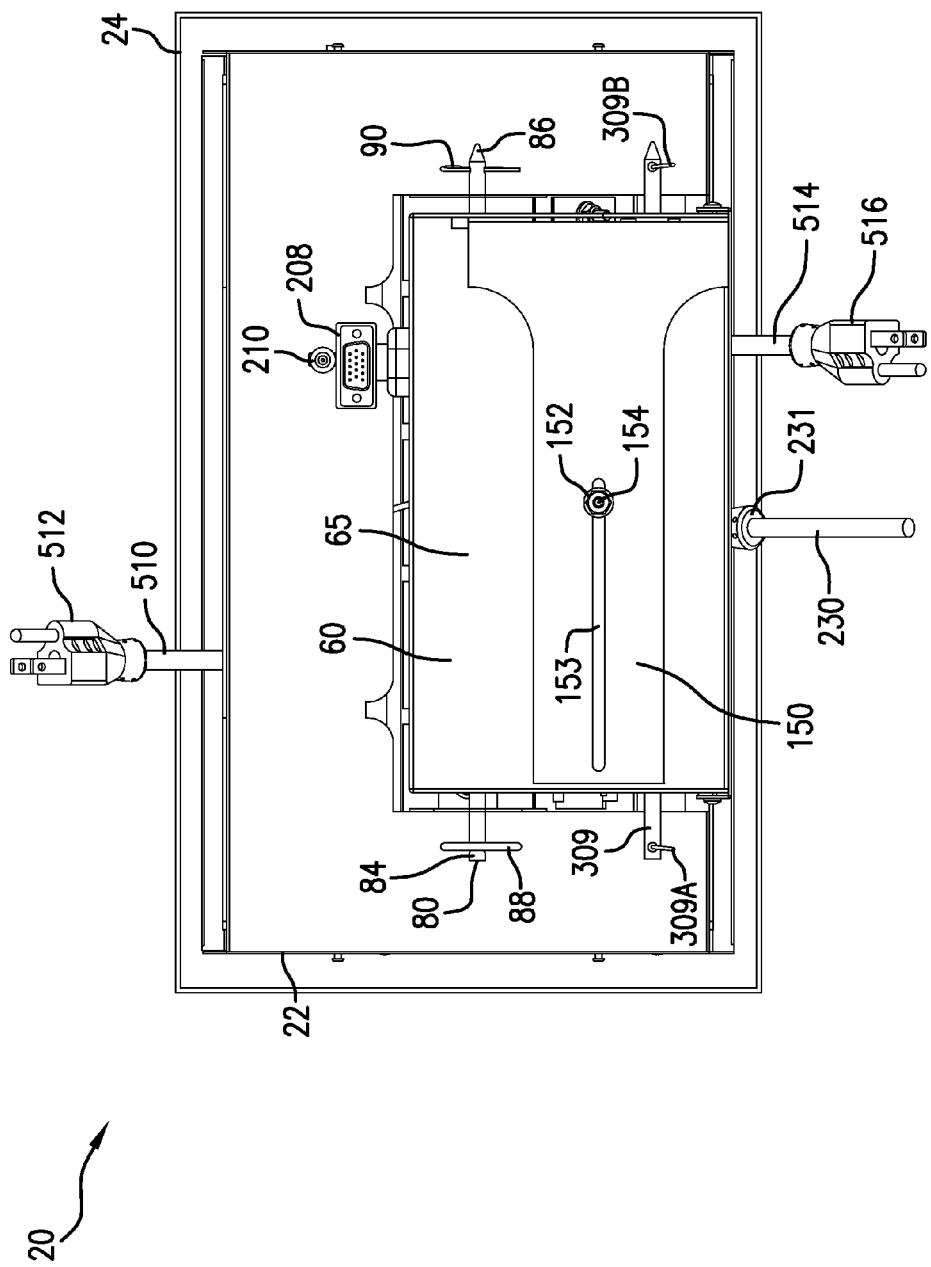
FIG. 4 is a view taken along line 4-4 in FIG. 1.
Figure 5:
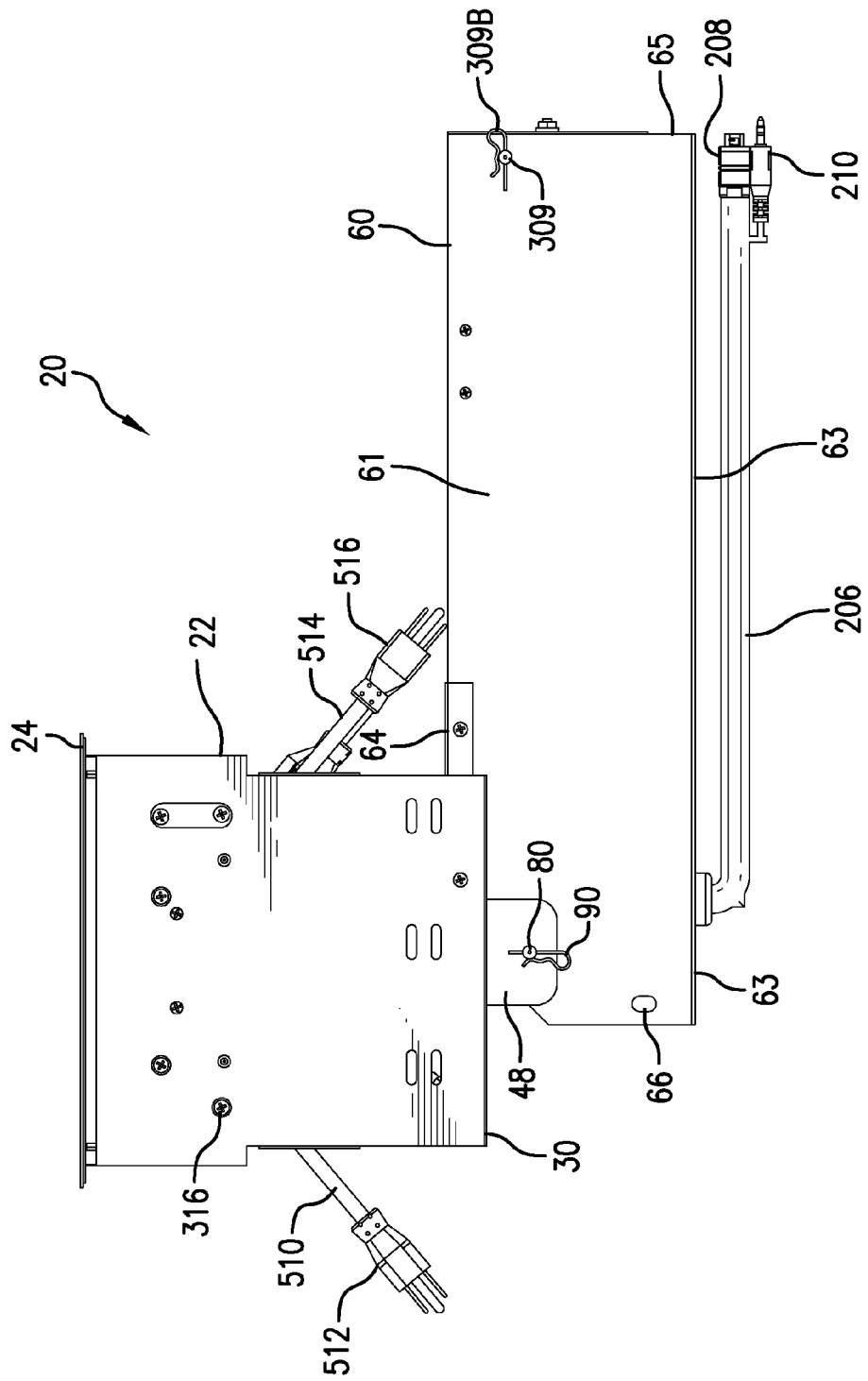
FIG. 5 is another left side view thereof, the view showing the component housing in the horizontal position.

Referring to FIGS. 2, 3, 5 and 6, apparatus 20 further comprises component housing 60 having first lengthwise wall 61, opposite, second lengthwise wall 62, top side 63, bottom side 64 and end panel 65. First lengthwise wall 61 has through-hole 66 (see FIG. 5) and second lengthwise wall 62 has through-hole 67 (see FIG. 6) that is aligned with through-hole 66 in first lengthwise wall 61. First lengthwise wall 61 also has through-hole 68 (see FIG. 2) and second lengthwise wall 62 also has through-hole 69 (see FIG. 3) that is aligned with through-hole 68. Through-holes 68 and 69 form a first pair of aligned through-holes of component housing 60 and through-holes 66 and 67 form a second pair of aligned through-holes of component housing 60. When component housing 60 is in the horizontal position, through-holes 68 and 69 are aligned with through-holes 50 and 52 in brackets 46 and 48, respectively. When component housing 60 is positioned in the vertical position, through-holes 66 and 67 are aligned with through-holes 50 and 52 in brackets 46 and 48, respectively. As shown in FIG. 4, component housing 60 includes support plate 150 that is movably attached to end panel 65. Support plate 150 has flanged end 151, the purpose of which is described in the ensuing description. Support plate 150 is movably attached to end panel 65. Support plate 150 is movably attached to end panel 65 with nut 152 and screw 154. Support plate 150 can be rotated by loosening nut 152. Support plate 150 can be removed completely by loosening and removing nut 152.

Figure 23:
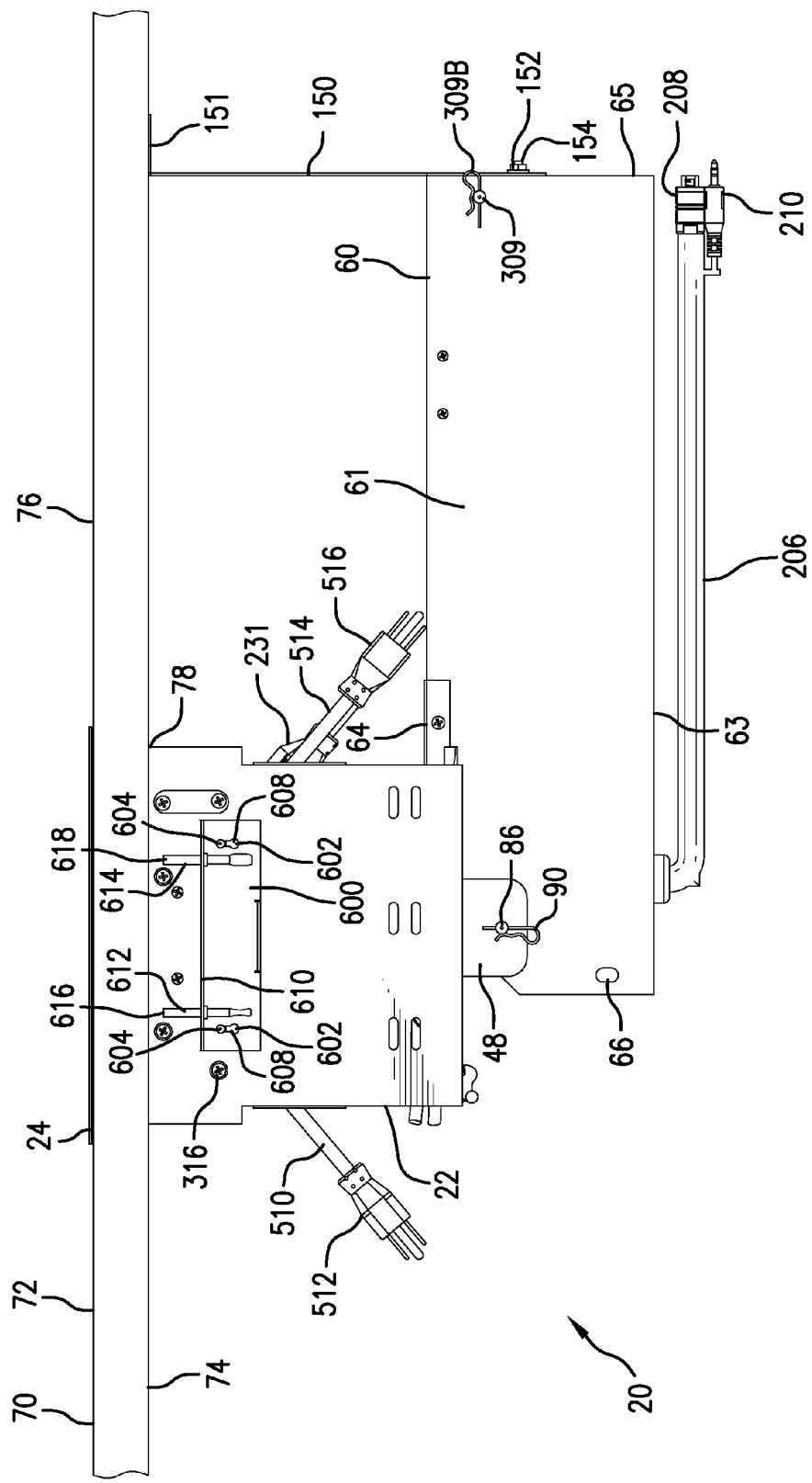
FIG. 23 is a side elevational view of the apparatus of the present invention mounted to a workstation wherein the component housing is positioned in a horizontal position.

Referring to FIGS. 23 and 24, apparatus 20 is configured to be mounted to work station 70. Work station 70 comprises top side 72 and bottom side 74. Top side 72 has work surface 76. Work station 70 has opening 78 therethrough. Component housing 60 and all portions of receptacle enclosure housing 22, except peripheral portion 24, are sized to fit into opening 78 such that peripheral portion 24 rests upon work surface 76 and the remaining portion of receptacle enclosure housing 22 and the entire component housing 60 is positioned below work surface 76. Peripheral portion 24 prevents apparatus 20 from falling through opening 78.

Referring to FIGS. 10, 12, 18, 19, 20, 22A and 22B, apparatus 20 further comprises a plurality of identical and separate video signal cables 100. In this embodiment, each video signal cable 100 is a VGA cable. Each cable 100 has a first end within component housing 60 and a second end within interior region 28 of receptacle enclosure housing 22 and accessible through top opening 26. Connector 102 is connected to the first end of cable 100 and connector 104 is connected to the second end of cable 100. Excess cable 100 is tied in a bundle and is indicated by reference number 100A (see FIG. 12). Apparatus 20 further comprises switching device 200 which is located in component housing 60. In this embodiment, switching device 200 is a VGA switching device. Switching device 200 may be realized by any suitable commercially available VGA switching device. One example of a suitable commercially available VGA switching device is manufactured by Extron Electronics of Anaheim, Calif. under Model No. SW4 VGA Ars. Switching device 200 comprises a plurality of VGA signal inputs 202 and a VGA signal output 204. Each connector 102 of each cable 100 is connected to a corresponding one of the VGA signal inputs 202. Output VGA cable 206 comprises connector 207 that is connected to VGA signal output 204. Output VGA cable 206 includes connector 208 for connection to external, peripheral devices such as display screens, video monitors, etc. Audio connector 210 is connected to cable 206. Thus, switching device 200 can switch any one of a plurality of video signals provided to VGA signal inputs 202 by video signal cables 100 to VGA signal output 204 so that the desired video signal is coupled to VGA signal output 204 and routed to a peripheral device via output VGA cable 206. VGA switching device 200 further comprises a plurality of audio signal inputs 220. Each cable connector 102 includes an audio signal connector 224 that is configured to be connected to one of the audio signal inputs 220. VGA switching device 200 includes electrical power cable 230 for providing electrical power to the VGA switching device 200. Power cable 230 includes male plug 231 which is configured to be inserted into one of the additional power receptacles on the exterior of wiring boxes 500 and 504. One such power receptacle is power receptacle 518 which is on wiring box 500. Wiring box 504 also has such a power receptacle.

Figure 9:
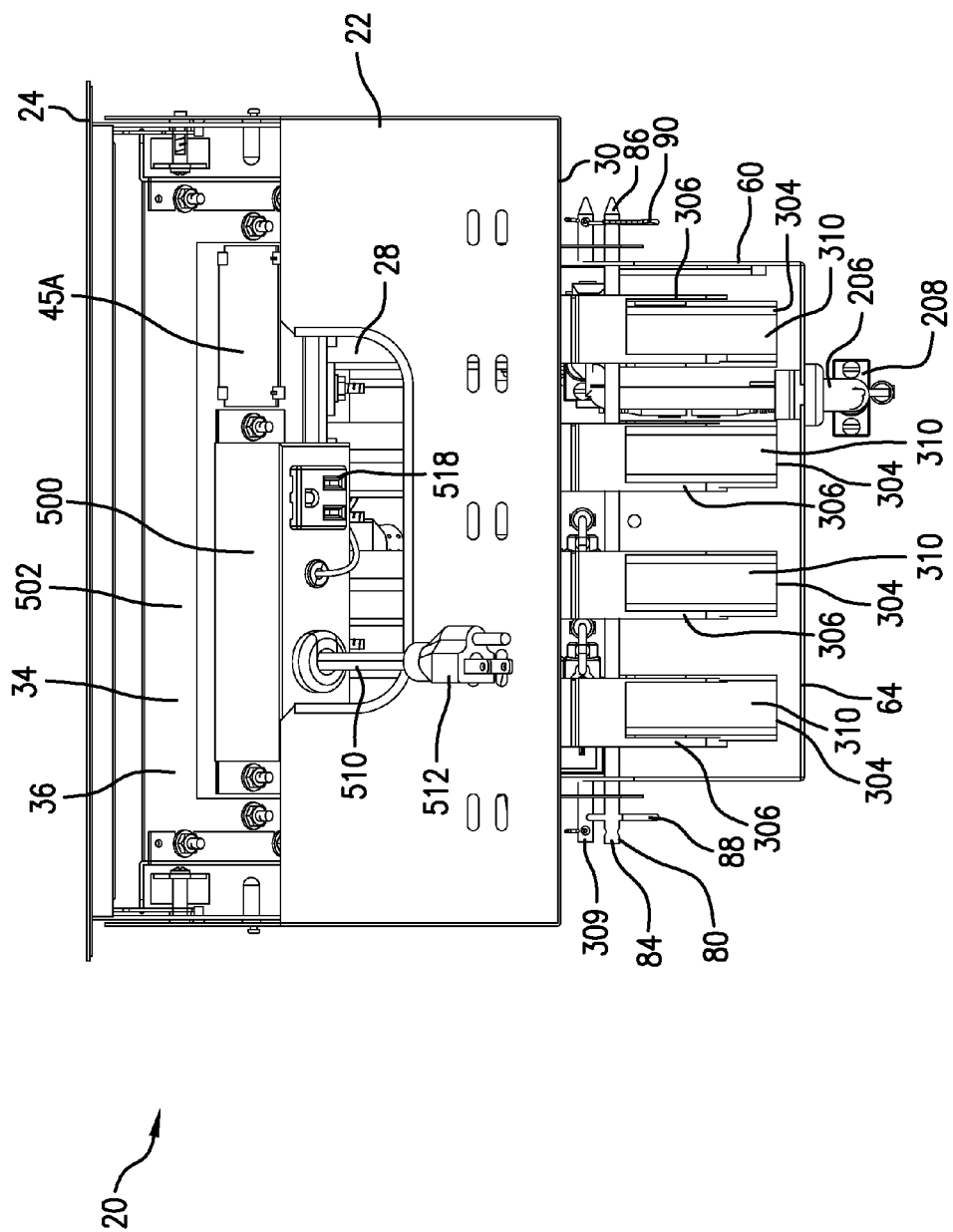
FIG. 9 is a rear end view thereof.

Referring to FIGS. 9, 14-17, 20, 21, apparatus 20 further comprises a plurality of cable retractors 300. Each cable retractor 300 is identical in construction, configuration and operation. Preferably, each cable retractor 300 is configured as the cable retractor disclosed in U.S. Patent Application Publication No. US2011/0006146, published Jan. 13, 2011, entitled "Cable Retractor", the disclosure of which patent application publication is incorporated herein by reference. A perspective view of the cable retractor is shown in FIG. 9 of the aforementioned U.S. Patent Application Publication No. US2011/0006146. Each cable retractor 300 engages a corresponding VGA cable 100. Each cable retractor 300 comprises a multi-section housing 302. Each multi-section housing 302 comprises pulley housing 304 that is located within and attached to component housing 60, and a cable stop housing 306. Each pulley housing 304 includes mounting lug 307 which defines lug aperture 308. All lug apertures 308 are coaxially aligned with each other. As shown in FIGS. 4, 5, 7, 11 and 12, apparatus 20 further comprises rod member 309 that is removably disposed within corresponding through-holes in lengthwise walls 61 and 62 of component housing 60 and through all lug apertures 308. Rod member 309 includes removable pins 309A and 309B. Rod member 309 secures cable retractor 300 to component housing 60 and pins 309A and 309B prevent rod 309 from being dislodged from the lug apertures 308 and the corresponding through-holes in lengthwise walls 61 and 62. As a result of this configuration, pulley housing 304 pivots together with component housing 60. In one embodiment, pins 309A and 309B are cotter pins that are inserted into bores formed in the ends of rod 309.

Figure 14:
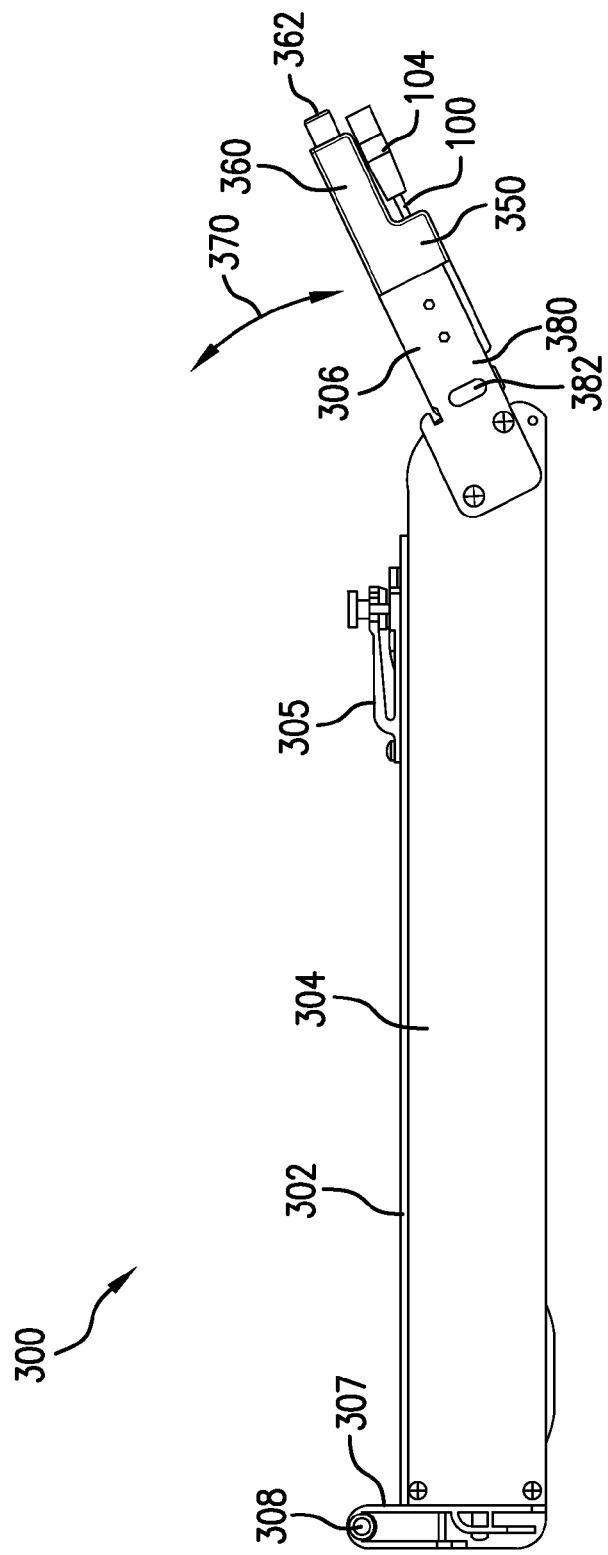
FIG. 14 is a side view, in elevation, of a cable retractor used in the apparatus of the present invention, the view showing a cable stop housing angulated with respect to a pulley housing.
Figure 15:
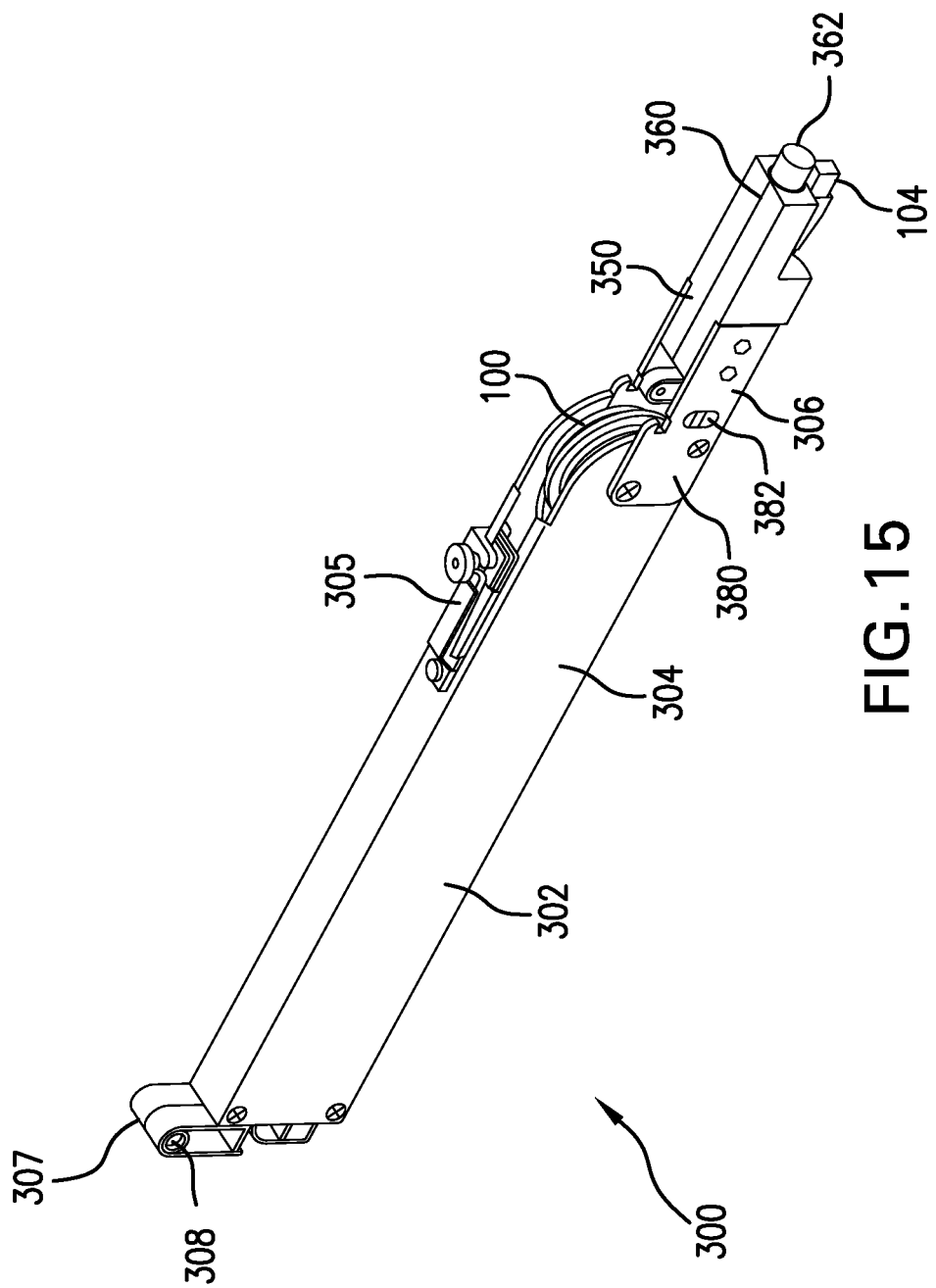
FIG. 15 is a perspective view of the cable retractor of FIG. 14, the cable stop housing pivoted such that it is generally coaxial with the pulley housing.
Figure 16:
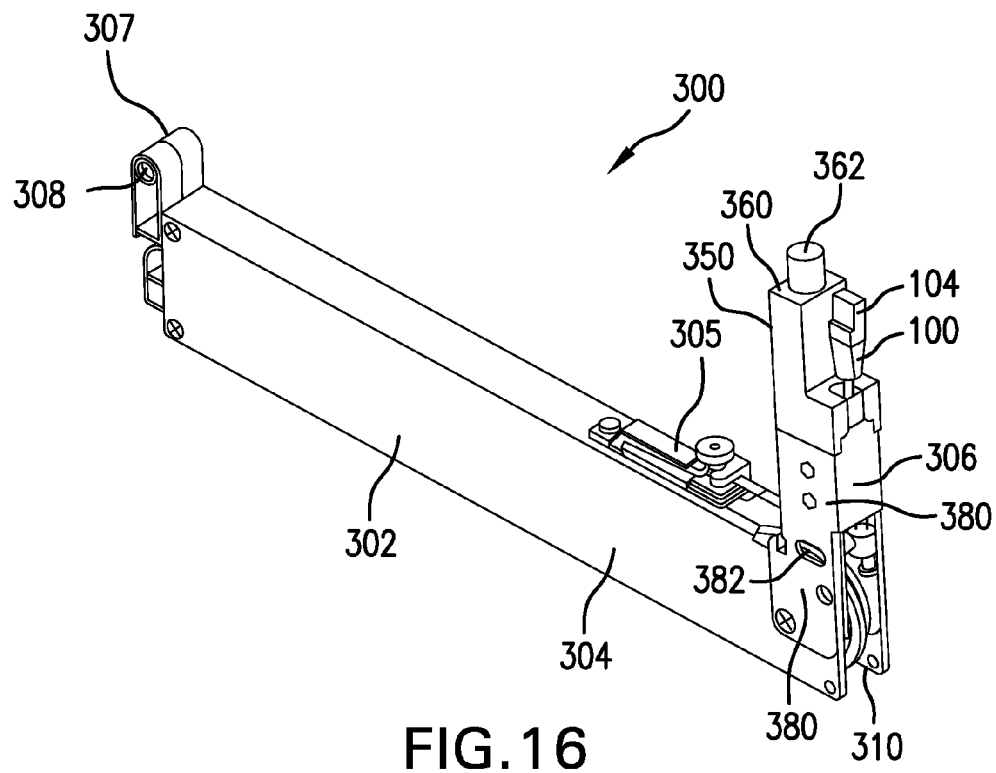
FIG. 16 is a perspective view of the cable retractor of FIG. 14, the cable stop housing being pivoted such that it is at a right angle to the pulley housing.
Figure 17:
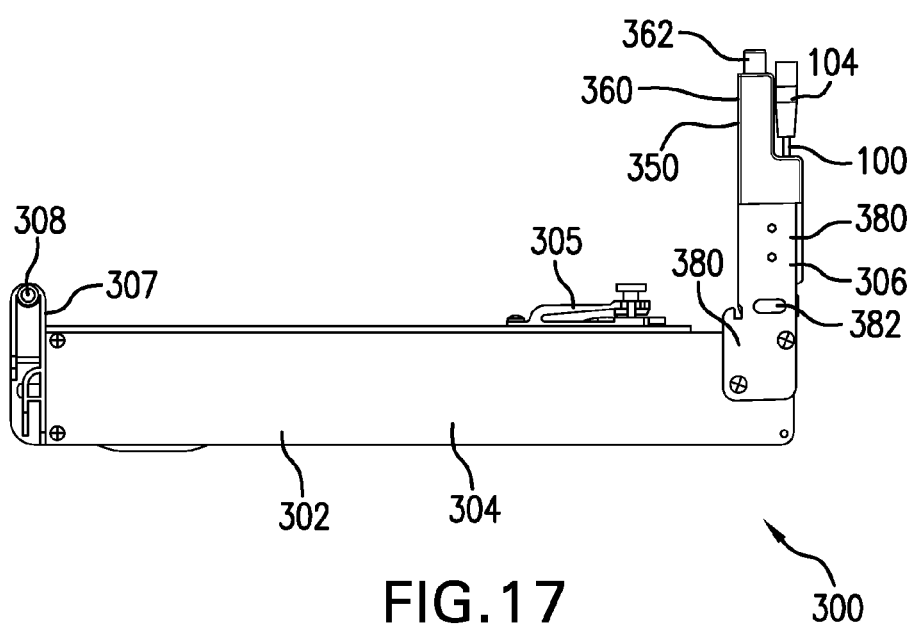
FIG. 17 is a side view, in elevation, of the cable retractor shown in FIG. 16, the cable stop housing being at a right angle to the pulley housing.
Figure 18:
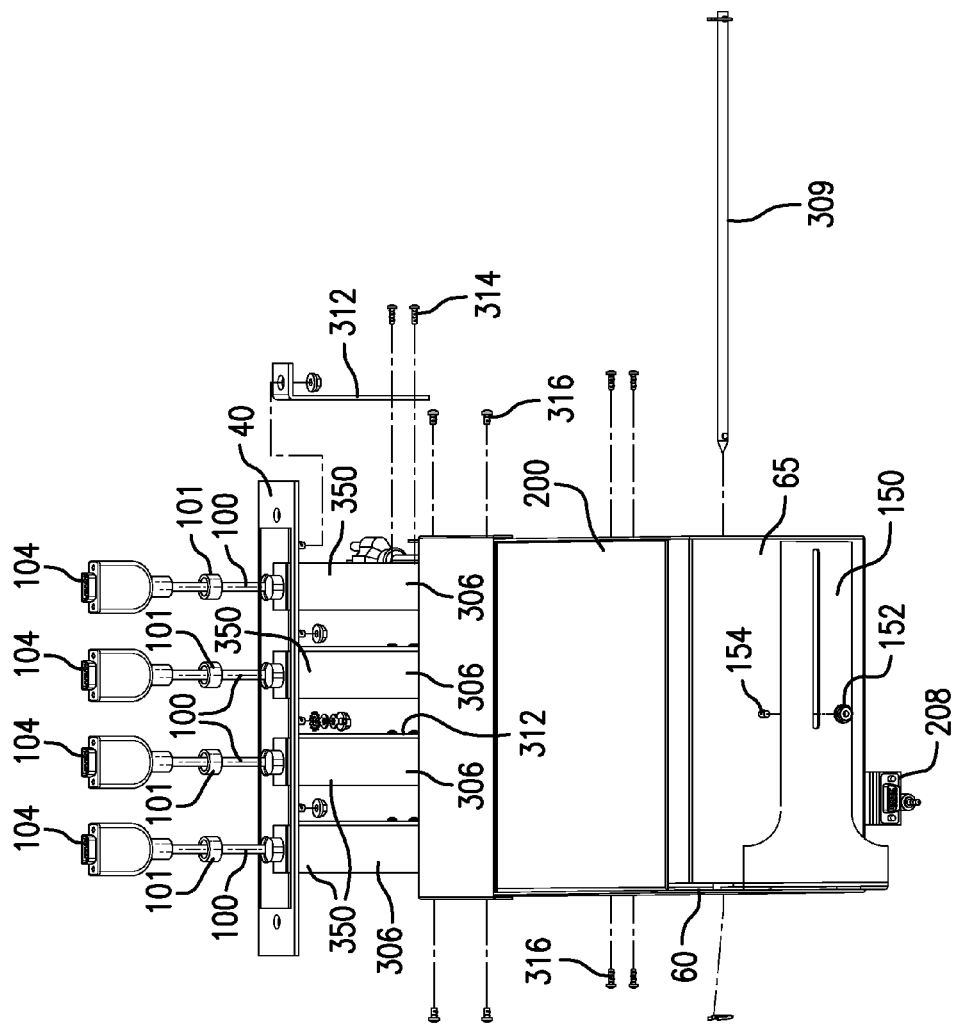
FIG. 18 is a partial, exploded view, seen from the front end of the component housing, of the apparatus of the present invention, wherein the component housing is in the horizontal position, the view not showing the receptacle enclosure housing in order to facilitate viewing of the cable stop housings and VGA cables.
Figure 19:
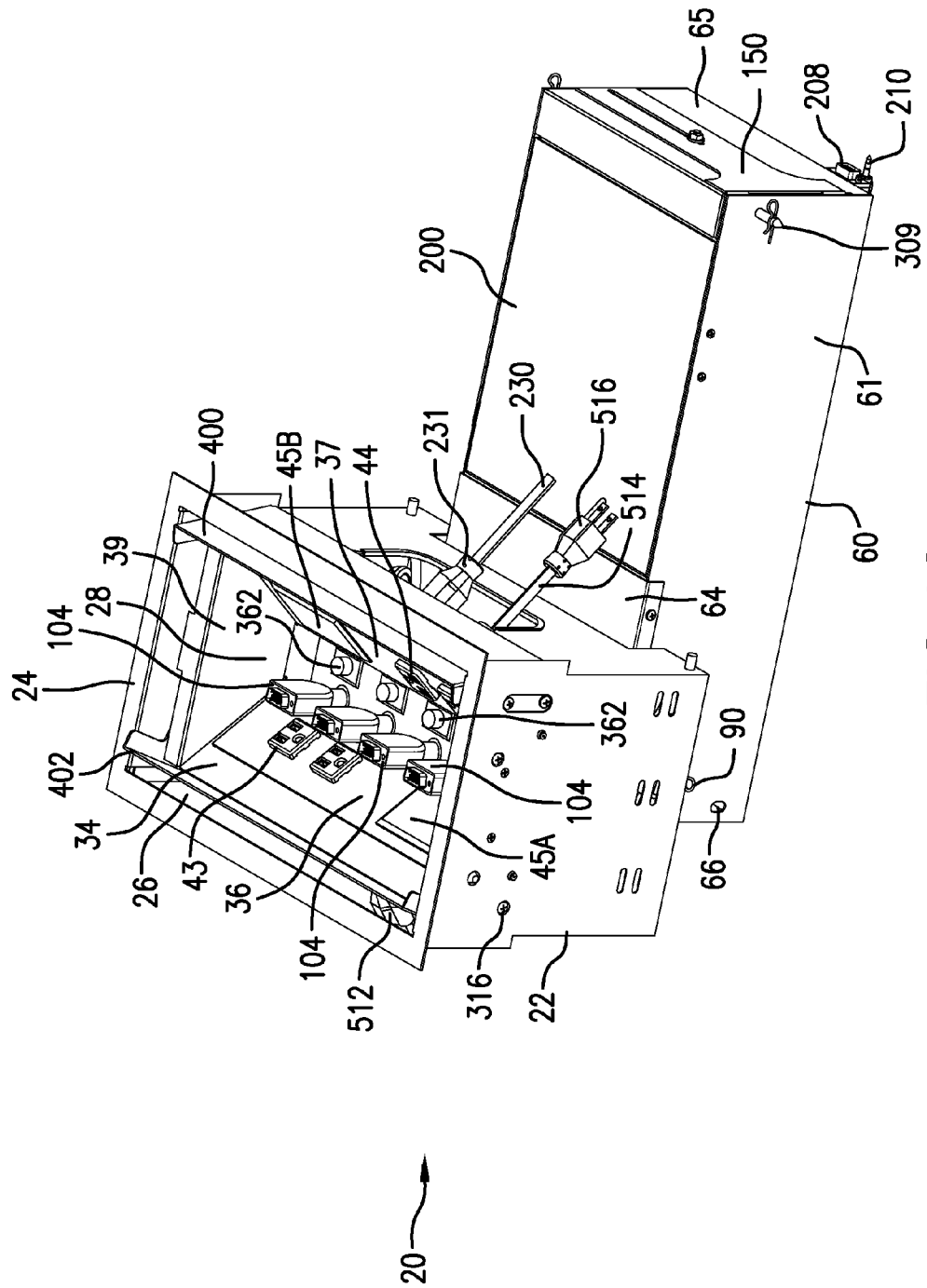
FIG. 19 is a perspective view of the apparatus of the present invention, the component housing being in the horizontal position.

Each cable stop housing 306 extends through opening 32 in bottom side 30 of receptacle enclosure housing 22 and into interior region 28. Each cable stop housing 306 is attached to plate member 40. As shown in FIG. 18, each cable stop housing 306 is attached to plate member 40 with a corresponding bracket 312. Each bracket 312 is attached to a corresponding cable stop housing 306 with screws 314. Cable stop housing 306 is pivotally coupled to pulley housing 304 such that pulley housing 304 and cable stop housing 306 can be rotated with respect to each other. As shown in FIG. 14, cable stop housing 306 can pivot in either direction as indicated by the bi-directional arrow 370. Pulley housing 304 pivots with respect to cable stop housing 306 when component housing 60 pivots with respect to receptacle enclosure housing 22. Each cable retractor 300 further comprises pulley assembly 310 within pulley housing 304. Pulley assembly 310 is configured to retract and retain a corresponding VGA cable 100. Each pulley assembly 310 further comprises a mechanism that produces a force that constantly urges the pulley assembly 310 to retract the corresponding VGA cable 100. Such a mechanism is described in the aforementioned U.S. Patent Application Publication No. US2011/0006146. A cable clamp assembly 305 is attached to each pulley housing 304 and regulates the retraction force of pulley housing 304. Cable clamp assembly 305 is identical to the cable clamp assembly that is described in the aforementioned U.S. Patent Application Publication No. US2011/0006146.

Figure 20:
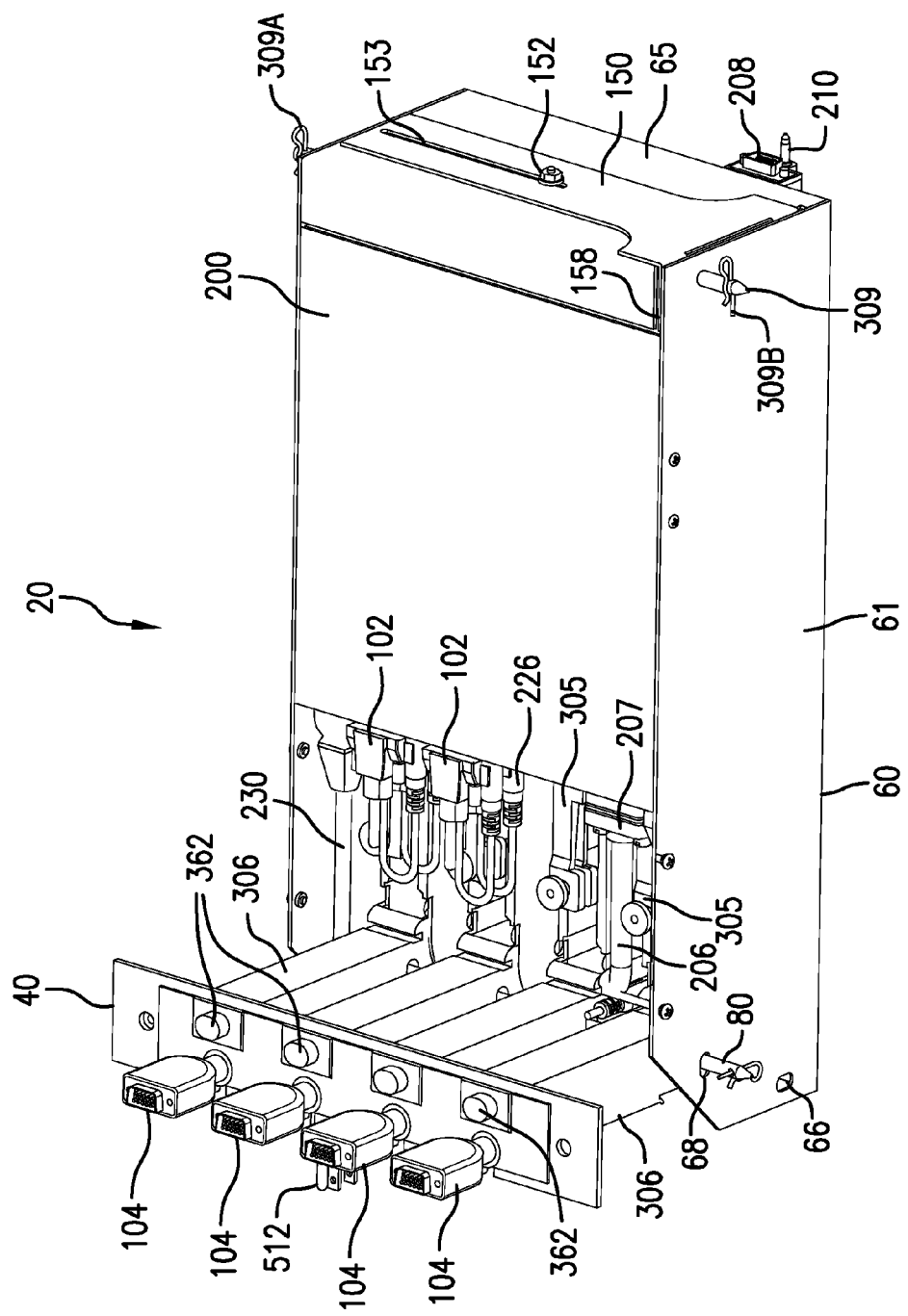
FIG. 20 is a perspective view of the apparatus of the present invention without the receptacle enclosure housing and top portion of the component housing in order to facilitate viewing of the interior of the component housing and the cable stop housing, cable stop assembly and cable stop actuator device, the component housing being in the horizontal position.
Figure 21:
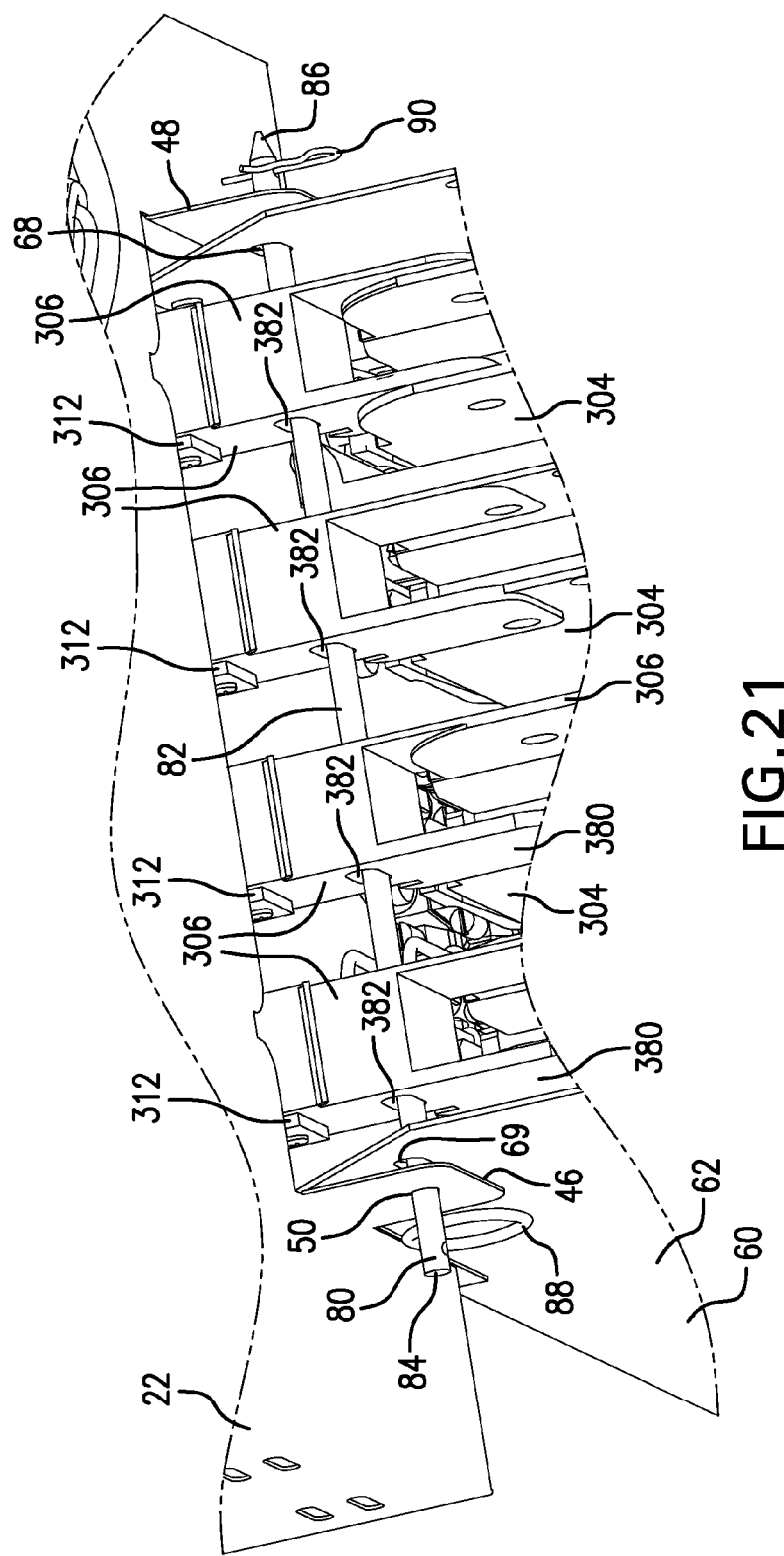
FIG. 21 is a partial, perspective view of the apparatus, the viewing showing an elongate member removably disposed within through-holes in brackets of the receptacle enclosure housing, through-holes in the walls of the component housing and through-holes in the cable stop housings.
Figure 22:
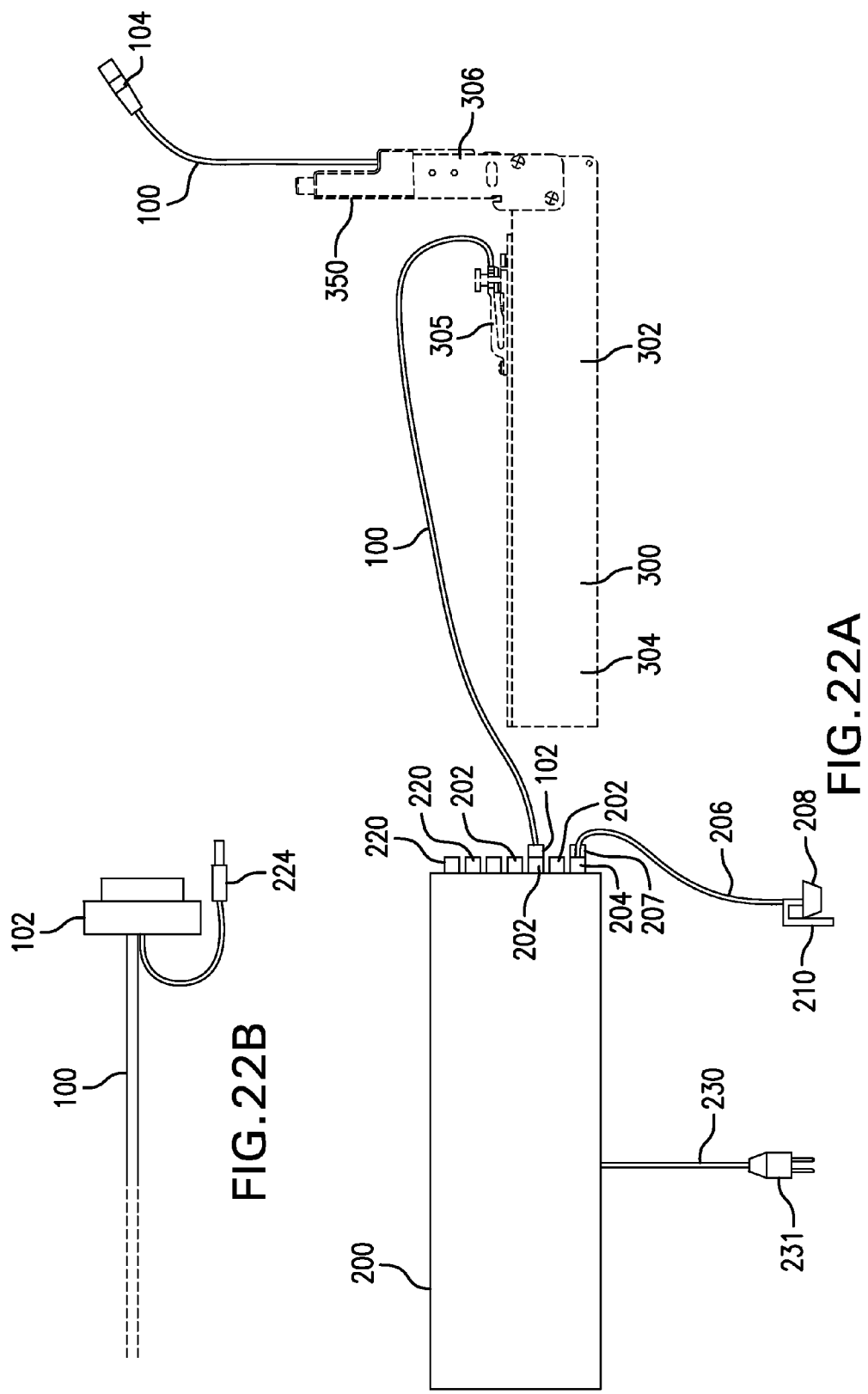
FIG. 22A is a block diagram illustrating the connection between the VGA cables and a VGA switching device used in the apparatus of the present invention.
FIG. 22B is a diagram of a portion of a VGA cable.

Referring to FIGS. 9, 14-17, 20, 21, each cable retractor 300 further comprises cable stop assembly 350 that is coupled to cable stop housing 306. Each VGA cable 100 is routed through cable stop housing 306 and cable stop assembly 350. Cable stop assembly 350 is configured to have a first state that frictionally detains the corresponding VGA cable 100 which prevents pulley assembly 310 from retracting the corresponding VGA cable 100 and a second state that releases the corresponding VGA cable 100 thereby allowing the pulley assembly 310 to retract the corresponding VGA cable 100. Cable stop assembly 350 is configured to be normally in the first state. Cable stop assembly 350 comprises cable stop actuator device 360 that configures cable stop assembly 350 to the second state to release the corresponding VGA cable 100 in order to enable pulley assembly 310 to retract the corresponding VGA cable 100. Cable stop actuator device 360 comprises actuator button 362 which, when depressed, configures cable stop assembly 350 to the second state. As shown in FIGS. 18 and 20, plate member 40, which forms the bottom of receptacle support structure 34, has a first plurality of openings therein and a second plurality of openings therein. Each opening in the first plurality of openings corresponds to an opening in the second plurality of openings. Each actuator button 362 extends through a corresponding opening of the first plurality of openings in plate member 40 and each corresponding VGA cable 100 extends through a corresponding opening of the second plurality of openings in plate member 40. A grommet 101 is positioned within each of the openings in the second plurality of openings in order to protect cables 100 from the edges of these openings. Each VGA cable 100 corresponds to an actuator button 362. Since cable stop assembly 350 is normally in the first state, a user can withdraw or pull a desired amount of VGA cable 100 from apparatus 20 without needing to depress actuator button 362 (see FIG. 22A). Once the user withdraws the desired amount of VGA cable 100, the user can then connect connector 104 to a device such as a personal computer, laptop or notebook computer, etc. Cable stop assembly 350 is configured such that once the user stops pulling or withdrawing the desired amount of VGA cable 100, the withdrawn VGA cable 100 will not be retracted unless the user depresses actuator button 362. Therefore, in order to enable cable retractor 300 to retract a corresponding VGA cable 100, the user must depress actuator button 362 so as to configure cable stop assembly 350 to the second state.

Referring to FIGS. 9, 20, 21 and 25B, each cable stop housing 306 has first sidewall 380 and an opposite sidewall 381. Side wall 380 has through-hole 382. Opposite sidewall 381 has through-hole 384 which is aligned with through-hole 382. Through-holes 382 and 384 of all cable stop housings 306 are aligned with through-holes 50 and 52 in brackets 46 and 48, respectively. Referring to FIGS. 1-6, 18-21 and 23-25B, apparatus 20 further comprises elongate member 80 that is used to secure component housing 60 either in the horizontal position or the vertical position. When the component housing 60 is in the horizontal position (see FIG. 23), the first pair of aligned through-holes 68 and 69 are aligned with through-holes 50 and 52 in brackets 46 and 48, respectively, and elongate member 80 is removably disposed through through-holes 50, 52, 68, 69 and all through-holes 382 and 384 of the cable stop housings 306. Elongate member 80 comprises shaft portion 82 which has first end 84, an opposite second end 86, and a handle member 88 that is movably attached to first end 84 to enable a user to withdraw elongate member 80 from all of the through-holes. In one embodiment, handle member 88 is configured as a ring. Elongate member 80 further comprises interfering member 90 removably attached to second end 86 to prevent elongate member 80 from becoming dislodged from the through-holes. In one embodiment, interfering member 90 is a cotter pin that is inserted through bore 92 (see FIG. 18). Elongate member 80 may be configured as a rod, pin or other suitable device. If the user desires to position component housing 60 in the vertical position (see FIG. 24), then the user must remove interfering member 90 from second end 86 of elongate member 86. Once interfering member 90 is removed, the user then grasps handle member 88 and withdraws elongate member 80 from through-holes 50, 52, 68, 69, 382 and 384. As described in the foregoing description, all of the pulley housings 304 are attached to component housing 60 via rod member 309 and each pulley housing 304 is pivotally attached to a corresponding cable stop housing 306 and all cable stop housings 306 are attached to plate member 40. Plate member 40 is attached to receptacle support structure 34 as described in the foregoing description. Therefore, once elongate member 80 is withdrawn from through-holes 50, 52, 68, 69, 382 and 384, component housing 60 is free to pivot downward to the vertical position. The user then adjusts the vertical position of component housing 60 so that the second pair of aligned through-holes 66 and 67 are aligned with through-holes 50 and 52 in brackets 46 and 48, respectively. The user then inserts elongate member 80 through through-holes 50, 52, 66, 67, 382 and 384. Once the elongate member 80 is completely inserted, then the user can then re-attach interfering member 90 to second end 86 of elongate member 80. If the user wishes to position component housing 60 back to the horizontal orientation (see FIG. 23), the user then removes interfering member 90 and then withdraws elongate member 80 from through-holes 50, 52, 66, 67, 382 and 384, and then grasps component housing 60 and pivots it upward to the horizontal position so than the first pair of aligned through-holes 68 and 69 are aligned with through-holes 50 and 52 of brackets 46 and 48, respectively. The user then reinserts elongate member into through-holes 50, 52, 68, 69, 382 and 384. One important advantage of apparatus 20 is that the use of elongate member 80 prevents having to mount a separate bracket, hook or similar device to bottom side 74 of work station 70 as is done in prior art devices.

Referring to FIG. 23, if component housing 60 is to be positioned in the horizontal position, then the user may loosen nut 152 and rotate support plate 150 so that flanged end 151 contacts bottom side 74 of work station 70. Once flanged end 151 firmly contacts bottom side 74, the user then tightens nut 152. Support plate 150 has slot 153 formed therein (see FIG.

Figure 25A:
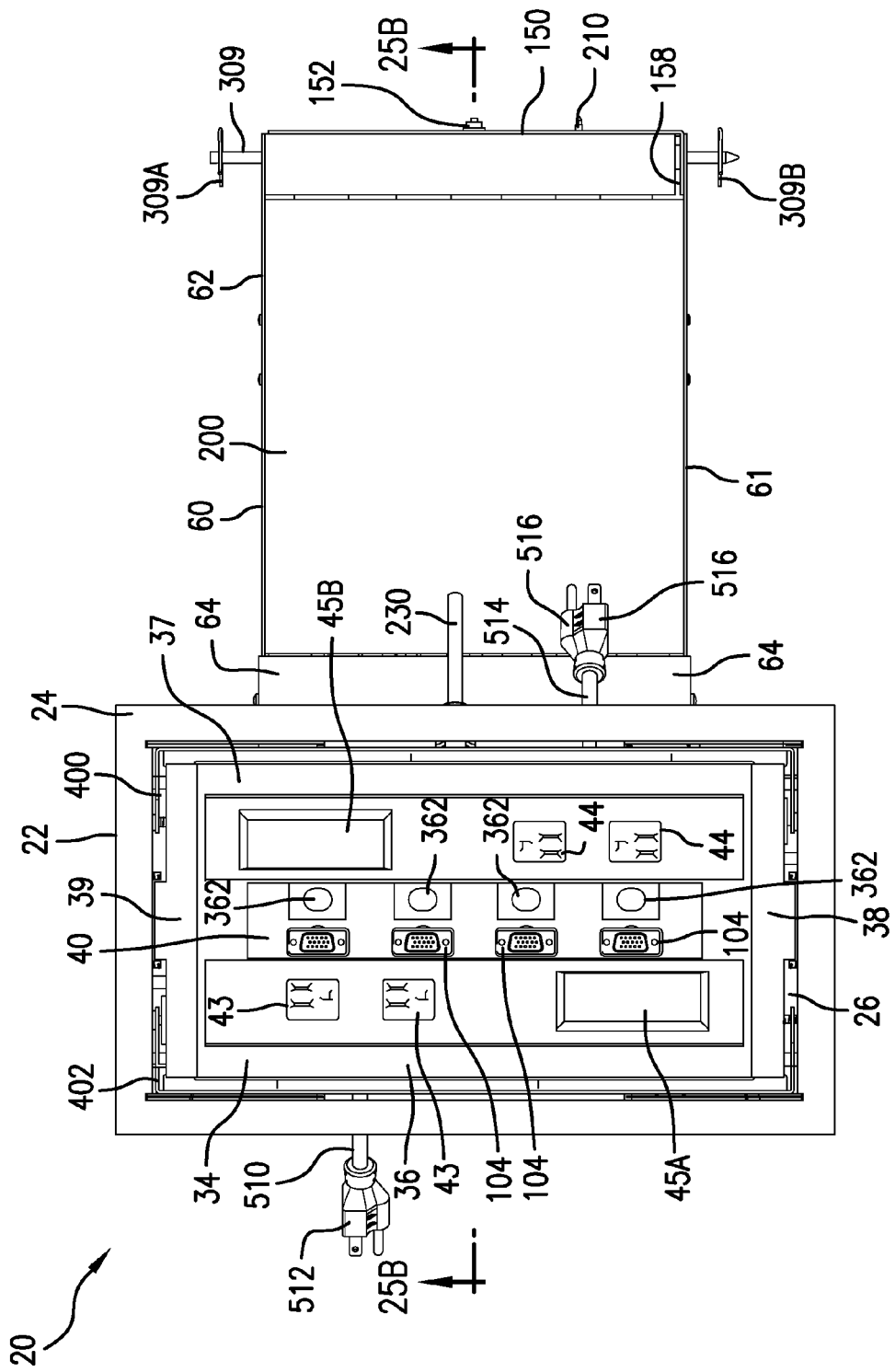
FIG. 25A is a top view of the apparatus of the present invention, the component housing being shown in the horizontal position.
Figure 25B:
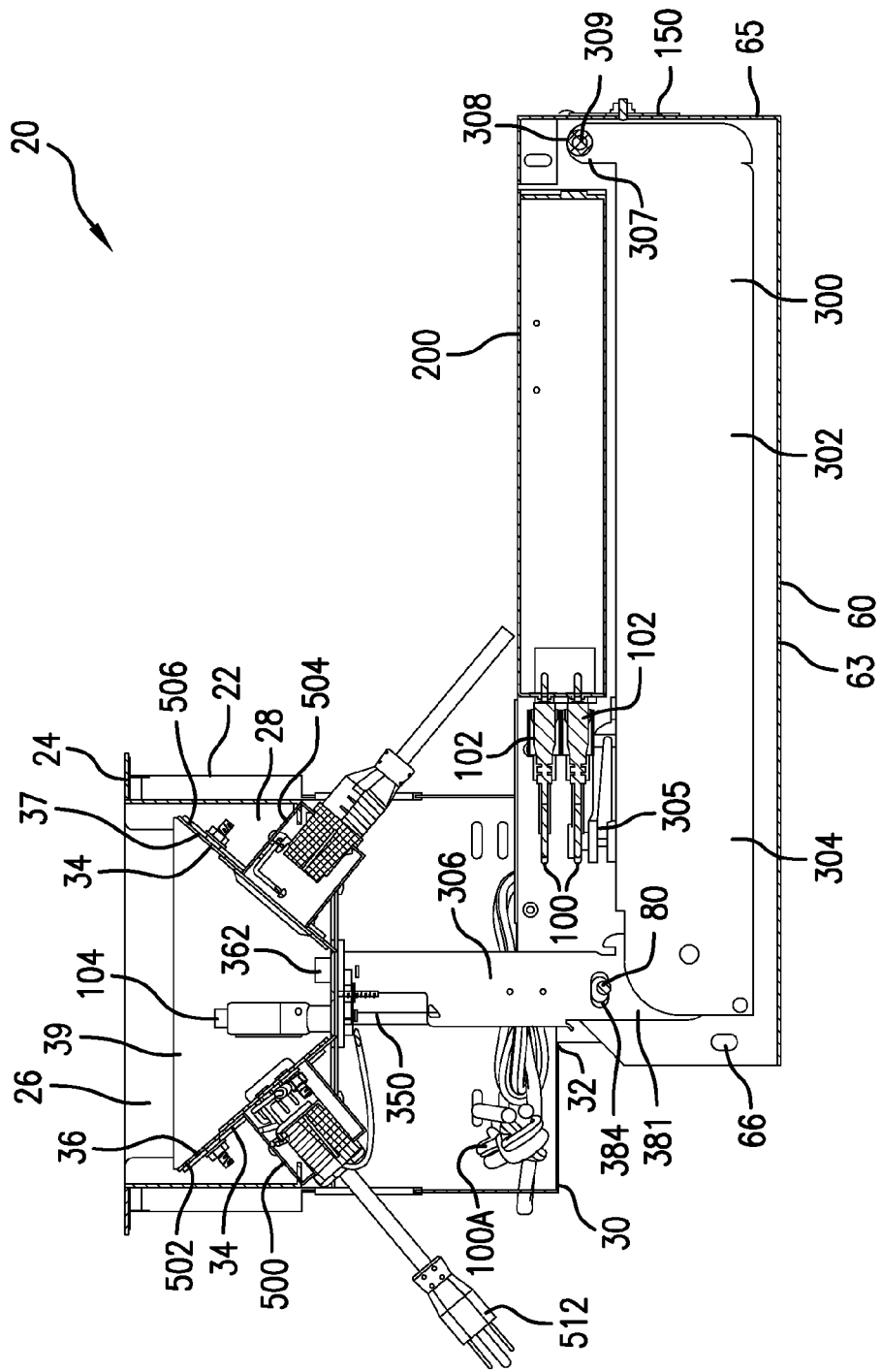
FIG. 25B is a cross-sectional view taken along line 25B-25B in FIG. 25A.

4) to allow the support plate 150 to be be adjusted upward when apparatus 20 is mounted to workstation 70. Support plate 150 adds further stability to component housing 60 and prevents component housing 60 from movement due to sudden or jarring forces exerted on work station 70. An important feature is that flanged end 151 is not attached to bottom side 74 but only contacts bottom side 74. As shown in FIGS. 20 and 25A, when support plate 150 is not used, it can be positioned on end panel 65 so that flanged end 151 is inserted into a space or gap between lengthwise wall 61 and end panel 65 or component housing 60. The aforesaid space or gap is generally indicated by reference number 158.

Figure 10:
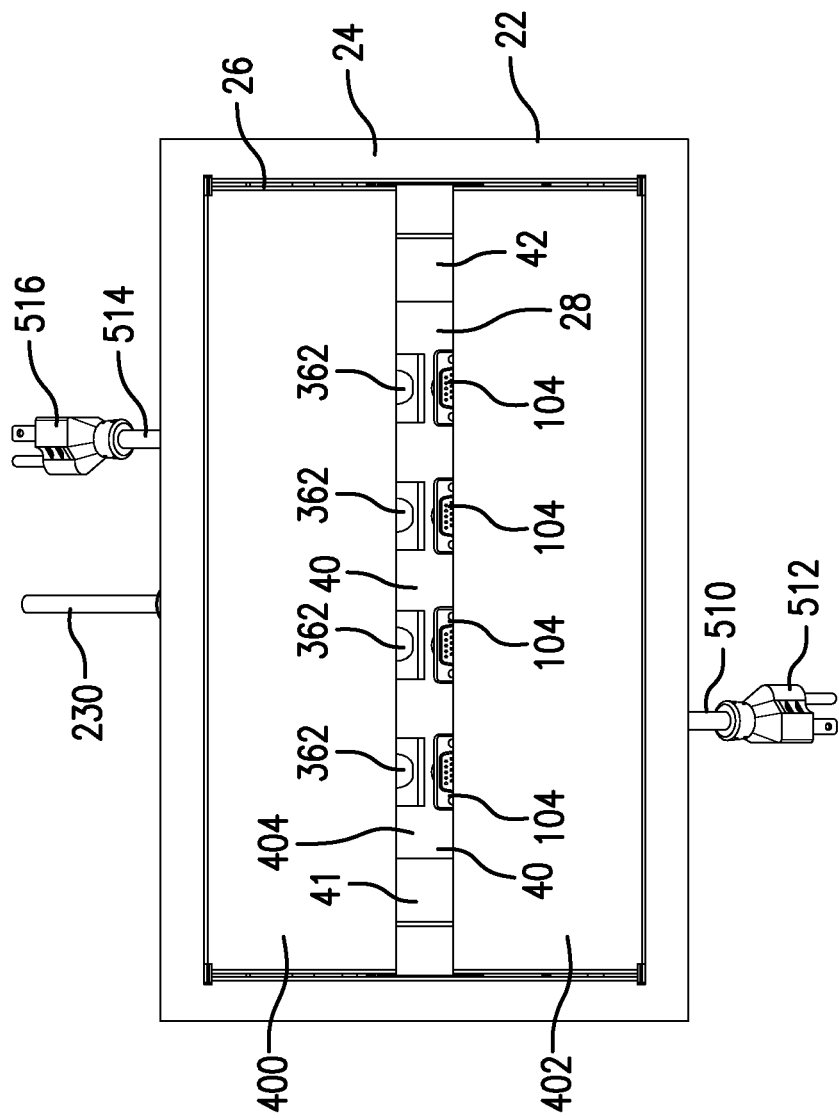
FIG. 10 is a top view thereof, the component housing being in the vertical position.
Figure 11:
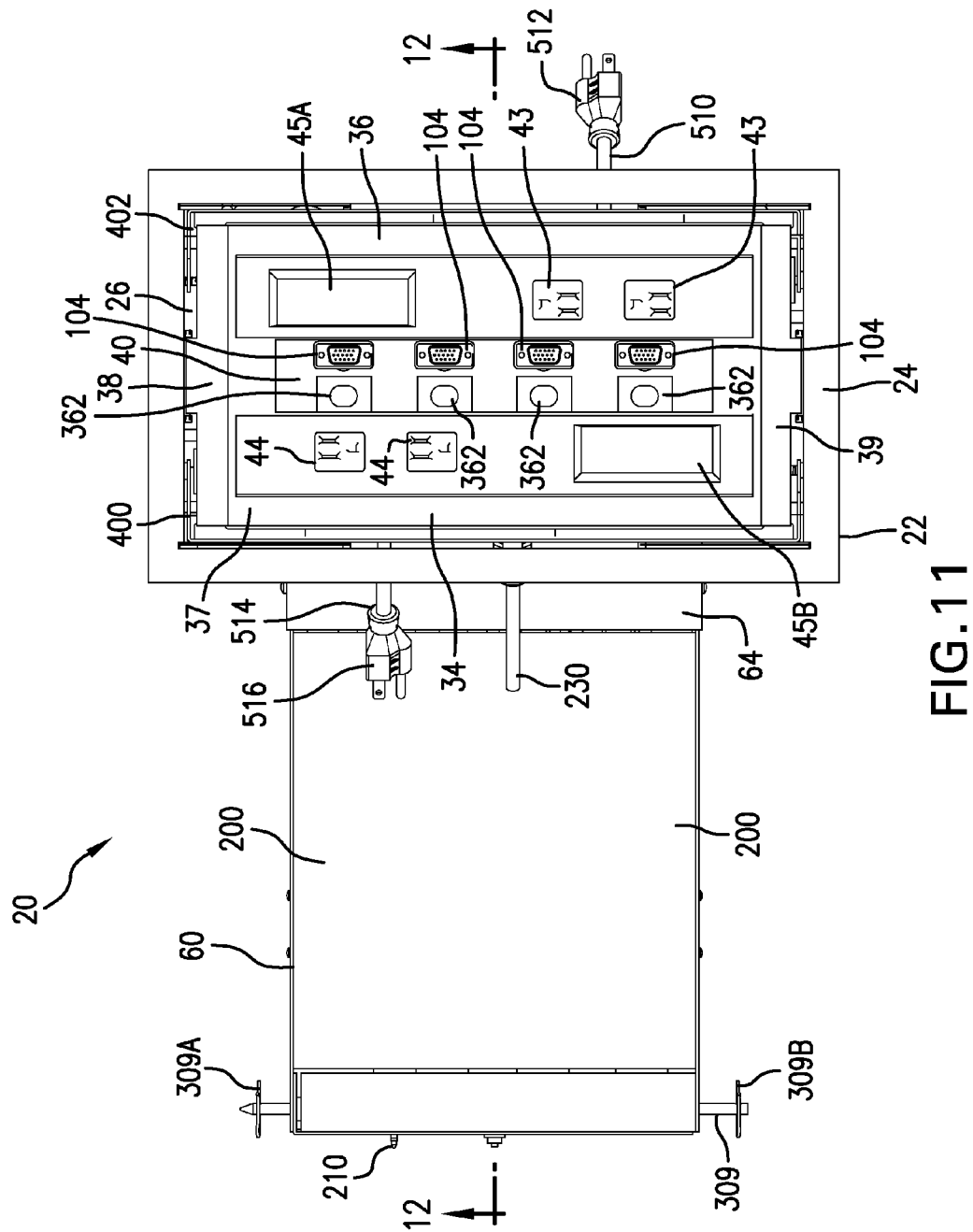
FIG. 11 is another top view thereof, the component housing being in the horizontal position.
Figure 13:
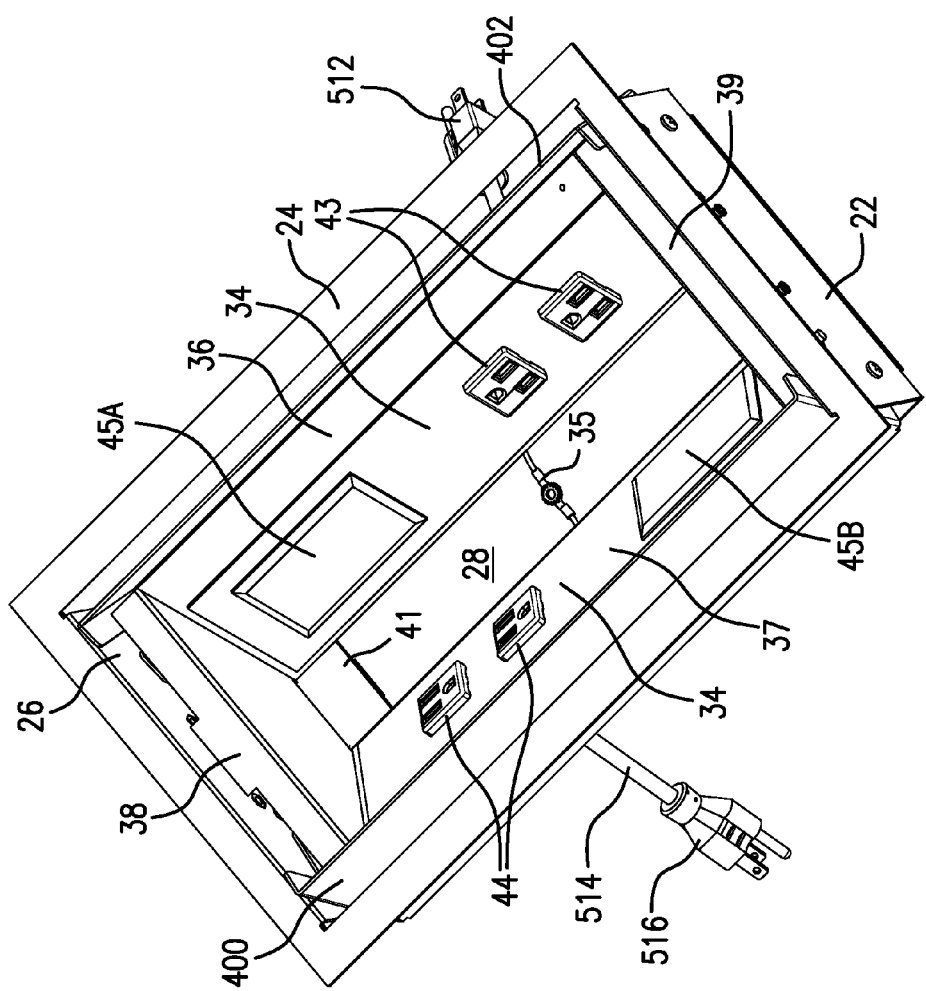
FIG. 13 is a perspective view of the receptacle enclosure housing, the view not showing the component housing in order to facilitate viewing of the structure of the receptacle enclosure housing.

Referring to FIGS. 10, 11 and 13, receptacle enclosure housing 22 further comprises a pair of lid members 400 and 402 that are pivotally attached to receptacle enclosure housing 22. Lid members 400 and 402 are movable between a closed position and an open position that provides access to the interior region 28. Lid members 400 and 402 are sized so that when lid members 400 and 402 are in the closed position, gap exists 404 between lid members 400 and 402 for the passage therethrough of VGA cables 100 and/or electrical wires. Lid members 400 and 402 provide the same function as the lid members described in the aforementioned U.S. Pat. No. 7,966,951. In an alternate embodiment, receptacle enclosure housing 22 includes the motion damper devices and bumper members described in U.S. Pat. No. 7,966,951 for use with lid members 400 and 402.

Referring to FIGS. 1, 9, 12, 13 and 19, apparatus 20 includes wiring box 500 that is attached to rear side 502 of lengthwise wall 36 of receptacle support structure 34, and wiring box 504 that is attached to rear side 506 of lengthwise wall 37 of receptacle support structure 34. Any suitable technique (e.g. screws) may be used to attach wiring boxes 500 and 504 to rear sides 502 and 506, respectively. The electrical contacts (not shown) of utility receptacles 43 and 44 are accessible on rear sides 502 and 506, respectively. Electrical power cable 510 extends through an opening in wiring box 500 and is electrically connected to the electrical contacts of utility receptacle 43 and the electrical contacts of external power receptacle 518 that is on the exterior of wiring box 500. Electrical power cable 510 includes plug 512 that is configured to be plugged into an AC power source (e.g. 115-120 VAC receptacle) not shown. Electrical power cable 514 extends through an opening in wiring box 504 and is electrically connected to the electrical contacts of utility receptacle 44 and the electrical contacts of the external power receptacle, not shown but similar to power receptacle 518, on wiring box 504. Electrical power cable 514 includes plug 516 that is configured to be plugged into an AC power source (e.g. 115-120 VAC receptacle) not shown. Wiring boxes 500 and 504 and rear sides 502 and 506, respectively, form compartments which prevent the emission of electromagnetic interference (EMI) or radio frequency interference (RFI) that may be carried on electrical power cables 510 and 514. Thus, the compartments formed by wiring boxes 500 and 504 and rear sides 502 and 506 prevent EMI and/or RFI from affecting the video and audio signals carried by VGA cables 100. Wiring boxes 500 and 504 also include the appropriate grounding wires.

Figure 6:
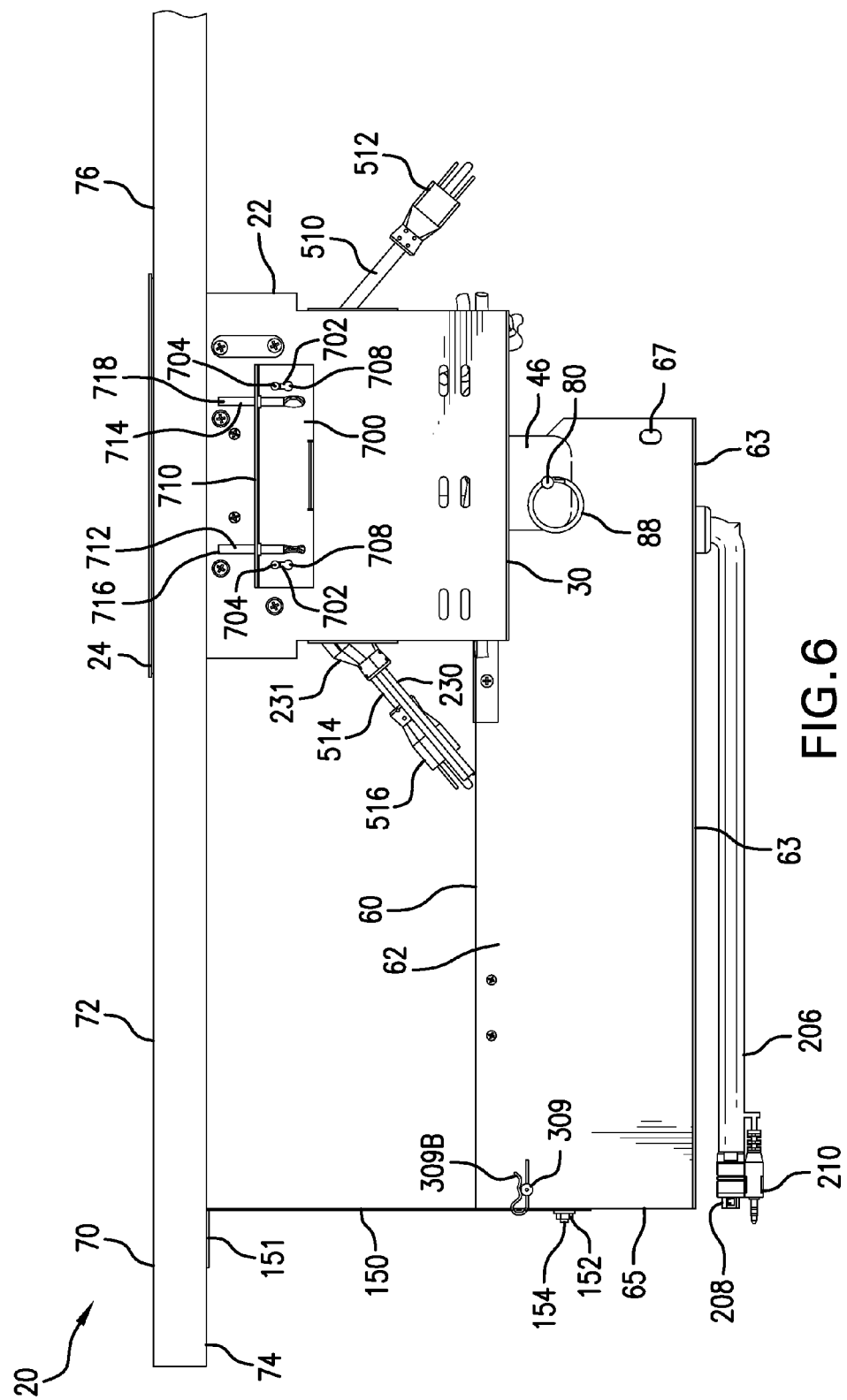
FIG. 6 is another right side view of thereof, the view showing the component housing in the horizontal position.
Figure 7:
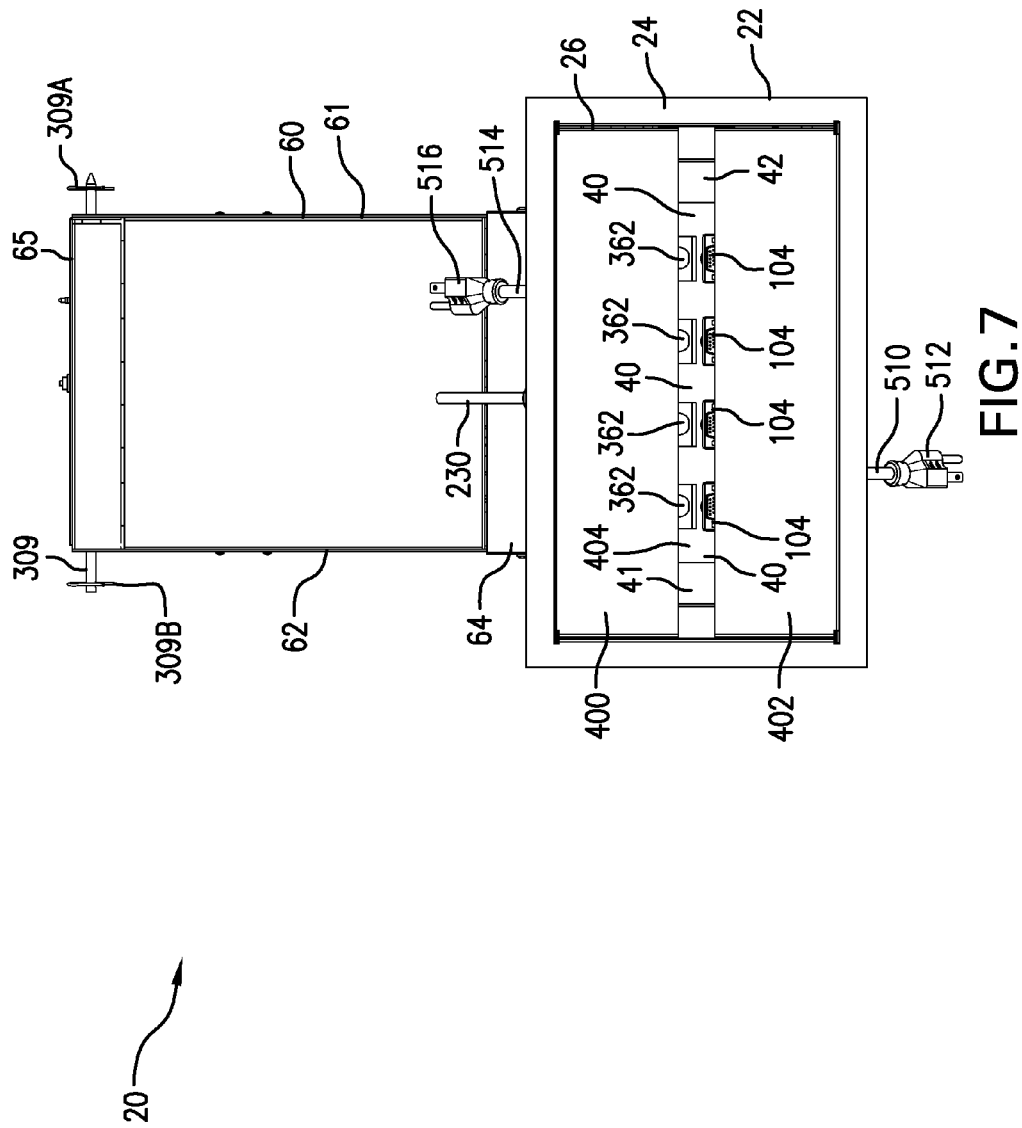
FIG. 7 is a top view of thereof, the view showing the component housing in the horizontal position.
Figure 8:
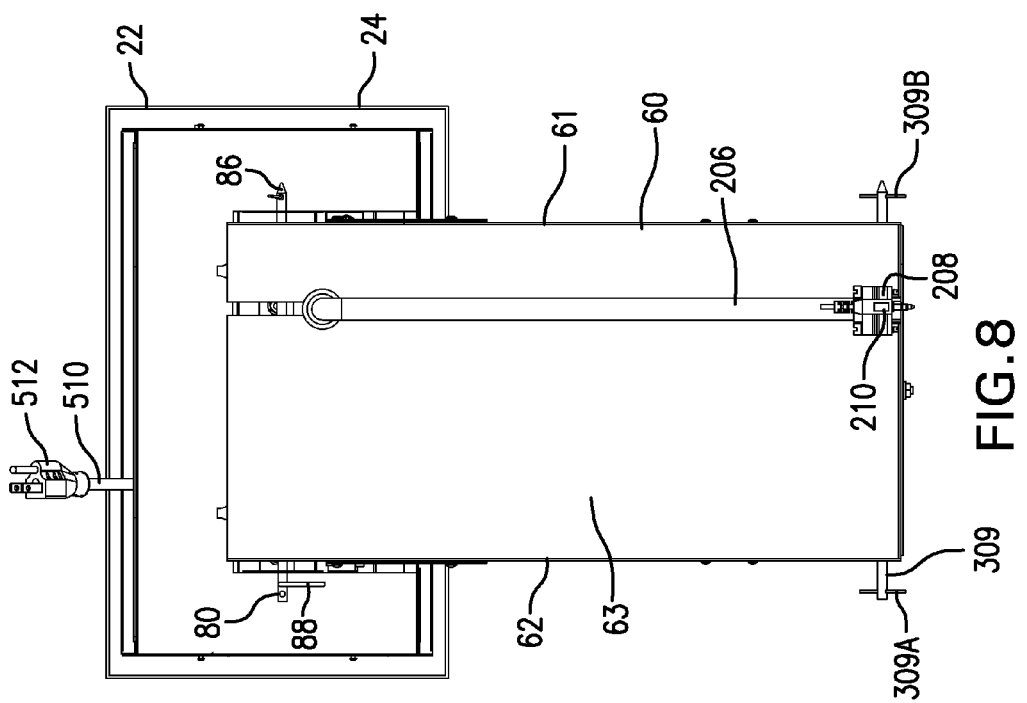
FIG. 8 is a bottom view thereof, the view showing the component housing in the horizontal position.

Referring to FIGS. 6, 23 and 24, apparatus 20 further comprises clamp member 600 that is on the left side of apparatus 20 and attached to receptacle enclosure housing 22. Clamp member 600 has a pair of slot openings 602. Screws 604 are inserted into slot openings 602 to attach clamp 600 to receptacle enclosure housing 22. Each slot opening 602 has a relatively wider portion 608. In order to remove clamp member 600 from receptacle enclosure housing 22, the user loosens screws 604 and then moves clamp member 600 so that portions 608 of slot openings 602 can be passed over the screw heads of screws 604. Clamp member 600 has a flanged end 610. Tightening member 612 and 614 are moveably attached to flanged end 610. Tightening member 612 has contact end 616 and tightening member 614 has contact end 618. When apparatus 20 is mounted to workstation 70, tightening members 612 and 614 are tightened against bottom side 74 of workstation 70. Specifically, when tightening members 612 and 614 are tightened, contact ends 616 and 618 firmly contact bottom side 74 of workstation 70 so as to lock apparatus 20 in place. In one embodiment, each tightening member 612 and 614 is configured as a wing screw. Similarly, apparatus 20 further comprises clamp member 700 that is on the left side of apparatus 20 and attached to receptacle enclosure housing 22 (see FIG. 6). Clamp member 700 has a pair of slot openings 702. Screws 704 are inserted into slot openings 702 to attach clamp 700 to receptacle enclosure housing 22. Each slot opening 702 has a relatively wider portion 708. In order to remove clamp member 700 from receptacle enclosure housing 22, the user loosens screws 704 and then moves clamp member 700 so that portions 708 of slot openings 702 can be passed over the screw heads of screws 704. Clamp member 700 has a flanged end 710. Tightening member 712 and 714 are moveably attached to flanged end 710. Tightening member 712 has contact end 716 and tightening member 714 has contact end 718. When apparatus 20 is mounted to workstation 70, tightening members 712 and 714 are tightened against bottom side 74 of workstation 70. Specifically, when tightening members 712 and 714 are tightened, the contact ends 716 and 718 firmly contact bottom side 74 of workstation 70 so as to lock apparatus 20 in place. In one embodiment, each tightening member 712 and 714 is configured as a wing screw.

Apparatus 20 can be fabricated from a variety of suitable materials. Examples of such materials are aluminum, stainless steel, steel, etc. Other suitable materials may be used. It is to be understood that other types of utility receptacles can be used with receptacle support structure 34, such as USB ports, telephone jacks, Ethernet ports, Firewall ports, HDMI ports, and any registered jack including RJ11, RJ14, RJ21, RJ45 and RJ48.

In an alternate embodiment, lengthwise wall 36 of receptacle support structure 34 has an opening extending for a substantially portion of the length of lengthwise wall 36, and receptacle 43 and wiring box 500 are configured as a module that can be positioned within the lengthwise opening in lengthwise wall 36 and attached to lengthwise wall 36. Similarly, in such an alternate embodiment, lengthwise wall 37 of receptacle support structure 34 has an opening extending for a substantially portion of the length of lengthwise wall 37, and receptacle 44 and wiring box 504 are configured as a module that can be positioned within the lengthwise opening in lengthwise wall 37 and attached to lengthwise wall 37.

In an alternate embodiment, apparatus 20 uses the cable cord retractor described in U.S. Patent Application Publication No. 2012/0175452, the disclosure of which patent application publication is hereby incorporated by reference.

The principles, preferred embodiments and modes of operation of the present invention have been described in the foregoing specification. The invention which is intended to be protected herein should not, however, be construed as limited to the particular forms disclosed, as these are to be regarded as illustrative rather than restrictive. Variations and changes may be made by those skilled in the art without departing from the spirit of the invention. Accordingly, the foregoing detailed description should be considered as exemplary in nature and not as limiting the scope and spirit of the invention as set forth in the attached claims.

What is claimed is:

1. An apparatus for providing utility receptacles and cables at a selected location of a workstation, comprising:

a receptacle enclosure housing having an upper peripheral portion, a top opening surrounded by the upper peripheral portion and an interior region that is accessible through the top opening, the receptacle enclosure housing including a bottom having a bottom opening that provides access to the interior region, the receptacle enclosure housing further comprising a pair of spaced apart and aligned through-holes, and a receptacle support structure located within the interior region, the receptacle support structure having a pair of walls, a bottom member and at least one utility receptacle attached to one of the walls;

a component housing having a first side which has a first plurality of through-holes therein and a second side which has a second plurality of through-holes therein, wherein a first through-hole in the first plurality of through-holes is aligned with a first through-hole in the second plurality of through-holes so as to form a first pair of aligned through-holes of the component housing, and wherein a second through-hole in the first plurality of through-holes is aligned with a second through-hole in the second plurality of through-holes so as to form a second pair of aligned through-holes of the component housing, the first pair of aligned through-holes of the component housing are aligned with the through-holes in the receptacle enclosure housing when the component housing is pivoted to a horizontal position and the second pair of aligned through-holes of the component housing are aligned with the through-holes in the receptacle enclosure housing when the component housing is pivoted to a vertical position;

wherein the component housing and all portions of the receptacle enclosure housing except the peripheral portion are sized to fit into an opening in a work surface of a work station such that the peripheral portion rests upon the work surface and the remaining portion of the receptacle enclosure housing and the entire component housing is positioned below the work surface; and an elongate member sized and shaped to be removably inserted through the first and second pairs of aligned through-holes of the component housing and the through-holes in the receptacle enclosure housing, wherein the elongate member is removably inserted through the through-holes of the receptacle enclosure housing and the first pair of aligned through-holes in order to maintain the component housing in a substantially horizontal position under a work surface of a work station, and wherein the elongate member is removably inserted through the through-holes of the receptacle enclosure housing and the second pair of aligned through-holes of the component housing in order to maintain the component housing in a substantial vertical position under the work surface of the work station.

2. The apparatus according to claim 1 further comprising a VGA cable having a first end within the component housing and a second end within the interior region of the receptacle enclosure housing and accessible through the top opening, the first end of the cable having a first VGA connector and the second end of the cable having a second VGA connector.

3. The apparatus according to claim 2 wherein the apparatus further comprises a VGA switching device located within the component housing, the VGA switching device having a plurality of VGA signal inputs and a VGA signal output, wherein the first VGA connector of the VGA cable is connected to one of the VGA signal inputs, the VGA switching device further comprising an output VGA cable connected to the VGA signal output, wherein the output VGA cable includes a VGA connector for connecting the output VGA cable to a peripheral device.

4. The apparatus according to claim 3 wherein the VGA switching device further comprises a plurality of audio signal inputs, wherein the first VGA connector includes an audio signal connector that is configured to be connected to one of the audio signal inputs.

5. The apparatus according to claim 3 further comprising means for providing electrical power to the VGA switching device.

6. The apparatus according to claim 3 further comprising a cable retractor that engages the VGA cable and comprises a multi-section housing comprising a pulley housing located within and attached to the component housing and a cable stop housing, wherein the cable stop housing extends through the opening in the bottom of the receptacle enclosure housing and into the interior region and wherein the cable stop housing is attached to the bottom member of the receptacle support structure, the cable stop housing being pivotally coupled to the pulley housing such that the pulley housing and cable stop housing can be rotated with respect to each other, wherein the pulley housing pivots with respect to the cable stop housing when the component housing pivots with respect to the receptacle enclosure housing.

7. The apparatus according to claim 6 wherein the cable retractor further comprises a pulley assembly within the pulley housing, the pulley assembly being configured to retract the VGA cable.

8. The apparatus according to claim 7 wherein the pulley assembly comprises a mechanism that produces a force that constantly urges the pulley assembly to retract the VGA cable.

9. The apparatus according to claim 8 wherein the cable retractor further comprises a cable stop assembly coupled to the cable stop housing, the VGA cable being routed through cable stop housing and the cable stop assembly, wherein the cable stop assembly is configured to have a first state that frictionally detains the VGA cable which prevents the pulley assembly from retracting the VGA cable and a second state that releases the VGA cable thereby allowing the pulley assembly to retract the VGA cable, the cable stop assembly being normally in the first state.

10. The apparatus according to claim 9 wherein the cable stop assembly comprises a cable stop actuator device that configures the cable stop assembly to the second state to release the VGA cable to enable the pulley assembly to retract the VGA cable.

11. The apparatus according to claim 10 wherein the cable stop actuator device comprises an actuator button which, when depressed, configures the cable stop assembly to the second state.

12. The apparatus according to claim 11 wherein the bottom member of the receptacle support structure has a first opening through which the actuator button extends and a second opening through which the VGA cable extends.

13. The apparatus according to claim 12 wherein the pair of walls of the receptacle support structure comprises a pair of lengthwise walls and wherein the receptacle support structure further comprises a pair of widthwise walls that are attached to the pair of lengthwise walls, and wherein each widthwise wall has a generally "V" shape that causes the pair of lengthwise walls to be angulated with respect to the bottom member.

14. The apparatus according to claim 13 wherein the utility receptacle is attached to one of the lengthwise walls of the receptacle support structure and wherein the utility receptacle includes electrical contacts for the connection of electrical wires.

15. The apparatus according to claim 14 wherein the utility receptacle comprises an AC power receptacle and wherein the apparatus further comprises means for providing electrical power to the electrical contacts.

16. The apparatus according to claim 1 wherein the elongate member comprises a shaft portion which has a first end, an opposite second end, and a handle member movably attached to the first end to enable a user to withdraw the elongate member from the through-holes of the receptacle enclosure housing and component housing.

17. The apparatus according to claim 16 wherein the handle member is configured as a ring.

18. The apparatus according to claim 16 wherein the elongate member further comprises an interfering member removably attached to the second end to prevent the elongate member from becoming dislodged from the through-holes in the receptacle enclosure housing and the component housing.

19. The apparatus according to claim 18 wherein the receptacle enclosure housing further comprises a pair of brackets extending from the bottom thereof, wherein the brackets are substantially perpendicular to the bottom of the receptacle enclosure housing and each bracket has a through-hole and wherein the through-holes of the brackets are aligned with each other.

20. The apparatus according to claim 19 wherein the component housing comprises an end portion near the receptacle enclosure housing and wherein the end portion is positioned between the pair of brackets such that the first pair of aligned through-holes are aligned with the through-holes in the brackets when the component housing is in a substantially horizontal position and the second pair of aligned through-holes are aligned with the through-holes in the brackets when the component housing is in a substantially vertical position, wherein the elongate member is removably inserted through the first pair of aligned through-holes and the through-holes in the brackets to maintain the component housing in the horizontal portion and wherein the elongate member is removably inserted through the second pair of aligned through-holes and the through-holes in the brackets to maintain the component housing in the vertical portion.

21. The apparatus according to claim 20 wherein the cable stop housing has a first sidewall having a through-hole and an opposite second sidewall having a through-hole that is aligned with the through-hole in the first sidewall, wherein the through-holes in the first and second sidewalls are aligned with the through-holes in the brackets, wherein the elongate member is removably inserted through the first pair of aligned through-holes, the through-holes in the brackets and the through-holes in the first and second sidewalls of the cable stop housing in order to maintain the component housing in the horizontal portion and wherein the elongate member is removably inserted through the second pair of aligned through-holes, the through-holes in the brackets and the through-holes in the first and second sidewalls of the cable stop housing in order to maintain the component housing in the vertical portion.

22. The apparatus according to claim 1 wherein the receptacle enclosure housing further comprises a pair of lid members movably attached to the receptacle enclosure housing and wherein each lid member is movable between a closed position and an open position that provides access to the interior region.

23. The apparatus according to claim 22 wherein the lid members are sized so that when the lid members are in the closed position, a gap exists between the lid members for the passage therethrough of VGA cables and/or electrical wires.

24. The apparatus according to claim 1 wherein the apparatus further comprises a VGA switching device located within the component housing, the VGA switching device having a plurality of VGA signal inputs and a VGA signal output, the VGA switching device further comprising an output VGA cable connected to the VGA signal output, wherein the output VGA cable includes a VGA connector for connecting the output VGA cable to a peripheral device.

25. The apparatus according to claim 24 further comprising a plurality of VGA cables, wherein each VGA cable has a first end within the component housing and a second end within the interior region of the receptacle enclosure housing and accessible through the top opening, the first end of each VGA cable having a first VGA connector and the second end of each VGA cable having a second VGA connector, wherein the first VGA connector of each VGA cable is connected to a corresponding VGA signal input of the VGA switching device.

26. The apparatus according to claim 25 further comprising a plurality of cable retractors, each cable retractor engaging a corresponding VGA cable and comprising a multi-section housing comprising a pulley housing located within and attached to the component housing and a cable stop housing pivotally coupled to the pulley housing such that the pulley housing and cable stop housing can be rotated with respect to each other, wherein the cable stop housing extends through the bottom opening in the bottom of the receptacle enclosure housing and extends into the interior region and is attached to the bottom member of the receptacle support structure, wherein the pulley housing pivots with respect to the cable stop housing when the component housing pivots with respect to the receptacle enclosure housing.

27. The apparatus according to claim 26 wherein each cable retractor further comprises a pulley assembly within the pulley housing, the pulley assembly being configured to retract the corresponding VGA cable and comprising a mechanism that produces a force that constantly urges the pulley assembly to retract the VGA cable.

28. The apparatus according to claim 27 wherein each cable retractor further comprises a cable stop assembly coupled to a corresponding cable stop housing, the VGA cable being routed through cable stop housing and the cable stop assembly, wherein the cable stop assembly is configured to have a first state that frictionally detains the corresponding VGA cable which prevents the pulley assembly from retracting the VGA cable and a second state that releases the corresponding VGA cable thereby enabling the pulley assembly to retract the VGA cable, the cable stop assembly being normally in the first state.

29. The apparatus according to claim 28 wherein each cable stop assembly comprises a cable stop actuator device that configures the cable stop assembly to the second state to release the VGA cable so as to enable the pulley assembly to retract the VGA cable.

30. The apparatus according to claim 29 wherein each cable stop actuator device comprises an actuator button which, when depressed, configures the cable stop assembly to the second state.

31. The apparatus according to claim 30 wherein the bottom member of the receptacle support structure has a first plurality of openings and a second plurality of openings, wherein each opening in the first plurality of openings corresponds to an opening in the second plurality of openings, wherein each actuator button extends through a corresponding one of the first plurality of openings and wherein a VGA cable extends from one of the openings of the second plurality of openings, each actuator button corresponding to one of the VGA cables.

\* \* \* \* \*